(12) United States Patent
Barraud et al.

(10) Patent No.: US 11,152,360 B2
(45) Date of Patent: Oct. 19, 2021

(54) ARCHITECTURE OF N AND P TRANSISTORS SUPERPOSED WITH CANAL STRUCTURE FORMED OF NANOWIRES

(71) Applicant: COMMISSARIAT A L'ENERGIE ATOMIQUE ET AUX ENERGIES ALTERNATIVES, Paris (FR)

(72) Inventors: Sylvain Barraud, Grenoble (FR); Jean-Pierre Colinge, Grenoble (FR); Bernard Previtali, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/723,285

(22) Filed: Dec. 20, 2019

(65) Prior Publication Data

US 2020/0203341 A1 Jun. 25, 2020

(30) Foreign Application Priority Data

Dec. 21, 2018 (FR) ...................... 18 73985

(51) Int. Cl.
*H01L 27/092* (2006.01)
*H01L 21/8238* (2006.01)
(Continued)

(52) U.S. Cl.
CPC ........ *H01L 27/092* (2013.01); *H01L 21/8221* (2013.01); *H01L 21/823807* (2013.01);
(Continued)

(58) Field of Classification Search
CPC . H01L 27/092; H01L 27/0688; H01L 27/088; H01L 21/8221; H01L 21/823814;
(Continued)

(56) References Cited

U.S. PATENT DOCUMENTS 9,831,131 B1 11/2017 Jacob
9,837,414 B1 * 12/2017 Balakrishnan ..............................
H01L 21/823871

(Continued)

OTHER PUBLICATIONS

French Preliminary Search Report dated Sep. 12, 2019 in French Application 18 73985 filed on Dec. 21, 2018 (with English Translation of Categories of Cited Documents), 3 pages.
(Continued)

*Primary Examiner* — Michael M Trinh
(74) *Attorney, Agent, or Firm* — Oblon, McClelland, Maier & Neustadt, L.L.P.

(57) ABSTRACT

Implementation of a device with stacked transistors comprising:
a first transistor of a first type, in particular N or P, the first transistor having a channel formed in one or more first semi-conducting rods of a semi-conducting structure including semi-conducting rods disposed above each other and aligned with each other,
a second transistor of a second type, in particular P or N, with a gate-surrounding gate and a channel region formed in one or more second semi-conducting rods of said semi-conducting structure and disposed above the first semi-conducting rods, the source block of the second transistor being distinct from the source and drain block of the second transistor, the drain block of the second transistor being distinct from the drain and source blocks of the second transistor.

6 Claims, 14 Drawing Sheets

(51) Int. Cl.
  H01L 29/10       (2006.01)
  H01L 29/423      (2006.01)
  H01L 27/06       (2006.01)
  H01L 21/822      (2006.01)

(52) U.S. Cl.
  CPC .......... *H01L 21/823814* (2013.01); *H01L 21/823871* (2013.01); *H01L 21/823885* (2013.01); *H01L 27/0688* (2013.01); *H01L 29/1037* (2013.01); *H01L 29/42392* (2013.01); *H01L 21/823828* (2013.01)

(58) Field of Classification Search
  CPC ..... H01L 21/823807; H01L 21/823871; H01L 21/823828; H01L 29/42392
  See application file for complete search history.

(56) References Cited

U.S. PATENT DOCUMENTS

| | | | |
|---|---|---|---|
| 9,991,261 B2* | 6/2018 | Mitard | H01L 29/165 |
| 10,381,438 B2* | 8/2019 | Zhang | H01L 29/42392 |
| 10,741,456 B2* | 8/2020 | Cheng | H01L 29/78654 |
| 2011/0298052 A1 | 12/2011 | Erickson et al. | |
| 2018/0040695 A1 | 2/2018 | Smith et al. | |
| 2018/0047832 A1 | 2/2018 | Tapily et al. | |
| 2018/0090387 A1 | 3/2018 | Jacob | |
| 2018/0315838 A1 | 11/2018 | Morrow et al. | |
| 2019/0157414 A1* | 5/2019 | Ando | H01L 29/78696 |
| 2020/0219979 A1* | 7/2020 | Rachmady | H01L 29/0847 |
| 2020/0286788 A1* | 9/2020 | Xie | H01L 29/0653 |
| 2021/0118901 A1* | 4/2021 | Yang | H01L 21/823487 |

OTHER PUBLICATIONS

A. Keshavarzi, et al., "Architecting Advanced Technologies for 14nm and Beyond with 3D FinFET Transistors for the Future SoC Applications", IEDM, 2011, 4 pages.

T. Yamashita, et al., "Sub-25nm FinFET with Advanced Fin Formation and Short Channel Effect Engineering", 2011 Symposium on VLSI Technology Digest of Technical Papers, 2011, 2 pages.

J.B. Chang, et al., "Scaling of SOI FinFETs down to Fin width of 4nm for the 10nm technology node", 2011 Symposium on VLSI Technology Digest of Technical Papers, 2011, 2 pages.

C.-H. Lin, et al., "Channel Doping Impact on FinFETs for 22nm and Beyond", 2012 Symposium on VLSI Technology Digest of Technical Papers, 2012, 2 pages.

L.K. Bera, et al., "Three Dimensionally Stacked SiGe Nanowire Array and Gate-All-Around p-MOSFETs", IEDM, 2006, 4 pages.

T. Ernst, et al., "Novel 3D integration process for highly scalable Nano-Beam stacked-channels GAA (NBG) FinFETs with $HfO_2$/TiN gate stack", IEDM, 2006, 4 pages.

K. Tachi, et al., "Relationship between mobility and high-k interface properties in advanced Si and SiGe nanowires", IEDM, 2009, 4 pages.

K. Tachi, et al., "Transport Optimization with Width Dependence of 3D-stacked GAA Silicon Nanowire FET with High-k/Metal Gate Stack", Silicon Nano Workshop, 2009, 2 pages.

S. Barraud, et al., Vertically Stacked-Nano Wires MOSFETs in a Replacement Metal Gate Process with Inner Spacer and SiGe Source/Drain, IEDM, 2016, 4 pages.

H. Mertens, et al, "Vertically Stacked Gate-All-Around Si Nanowire CMOS Transistors with Dual Work Function Metal Gates", IEDM, 2016, 4 pages.

Hiroshi Onoda, et al., "Si-Gate CMOS Devices on a $Si/CaF_2$/Si Structure", IEEE Transactions on Electron Devices, vol. ED-34, No. 11, Nov. 1987, 6 pages.

Yasuaki Hokari, et al., "Characteristics of MOS FET Prepared on $Si/MgO.Al_2O_3/SiO_2$/Si Structure", Tech. Digest IEDM, 1983, 4 pages.

U.S. Appl. No. 15/724,862, filed Oct. 4, 2017, 2018/0097095 A1, Barraud.

U.S. Appl. No. 16/054,197, filed Aug. 3, 2018, 2019/0043970 A1, Colinge.

U.S. Appl. No. 16/184,346, filed Nov. 8, 2018, 2019/0148367 A1, Colinge et al.

U.S. Appl. No. 16/697,558, filed Nov. 27, 2019, Barraud et al.

\* cited by examiner

ARCHITECTURE OF N AND P TRANSISTORS SUPERPOSED WITH CANAL STRUCTURE FORMED OF NANOWIRES

TECHNICAL FIELD AND STATE OF PRIOR ART

The present application relates to the field of the microelectronic devices with transistors, and more particularly that of devices with transistors of different types, in particular of the P-type and N-type, which are co-integrated and the channel region of which is formed by one or more semiconducting rod(s).

The FinFET transistors are provided with a channel structure in the form of a semi-conducting rod also called a "finger", or "fin", or "nano-wire", or "nano-beam", in other words a semi-conducting element with an oblong and typically parallelepipedal shape. One interest of this structure type is to be able to associate therewith a non-planar gate which extends around the rod in order to increase the current level per unit area while keeping a proper electrostatic control and thus a low leakage level in the off state of the transistor.

Transistors with channel structures formed by several semi-conducting rods disposed above each other have also appeared and allow a higher current level.

Documents: "Novel 3D integration process for highly scalable Nano-Beam stacked-channels GAA (NBG) FinFETs with HfO$_2$/TiN gate stack", IEDM 2006, by T. Ernst and al., or "Vertically Stacked-NanoWires MOSFET in a replacement metal gate process with inner spacer and SiGe source/drain", IEDM 2016 give exemplary embodiments of transistors having such channel structures.

In the devices adopting this structure type and including transistors of different types for example an NMOS transistor and a PMOS transistor, it is generally planned to position both transistors next to each other and to make the channel region of the NMOS transistor in a first structure with stacked semi-conducting rods and the channel structure of the PMOS transistor in a second structure with stacked semi-conducting rods which is juxtaposed to the first structure.

Such an arrangement however raises a size problem.

DISCLOSURE OF THE INVENTION

According to one aspect, one embodiment of the present invention relates to a device with stacked transistors comprising:
a first transistor of a first type, in particular N or P, the first transistor having a channel formed in one or more first semi-conducting rods of a semi-conducting structure including semi-conducting rods disposed above each other and aligned with each other, a first source or drain block of the first transistor and a second drain or source block of the first transistor being disposed at the ends of said one or more first semi-conducting rods, the first transistor being provided with a surrounding gate arranged around said one or more first rods;
a second transistor of a second type, in particular P or N, having a channel region formed in one or more second semi-conducting rods of said semi-conducting structure and disposed above the first semi-conducting rods, a third drain or source block of the second transistor and a fourth drain or source block being respectively disposed at the ends of said one or more second semi-conducting rods, the second transistor being provided with a surrounding gate arranged around said one or more second rods, the third source or drain block of the second transistor being distinct of the first source or drain block of the second transistor, the fourth drain or source block of the second transistor being disposed above and distinct of the second drain or source block of the second transistor.

Such an arrangement enables the integration density to be increased and the size in an integrated circuit or a chip to be significantly reduced while keeping a proper electric performances, in particular a high current level in the ON state and a low current in the OFF state.

According to one advantageous embodiment, the device can be provided with at least one first conducting element passing through the third block and in contact with said first block, said first conducting element being insulated from the third block through an insulating sheath surrounding said first conducting element.

The device can also be provided with a second conducting element passing through said fourth block and in contact with said second block, said second conducting element being surrounded by an insulating sheath, said through contact second element being insulated from said fourth block through said insulating sheath. Such an arrangement enables contact points to be made on the source and drain contact blocks of the lower transistor and participates in implementing a device with a reduced size.

Advantageously, the device can comprise at least one first contact stud also called a third conducting element in contact with said third block. The device can also comprise at least one second conducting contact stud also called a fourth conducting element in contact with said fourth block. Source and drain contact points of the higher level transistor can also be advantageously provided being independent of the contact points on the drain and source of the lower level transistor.

According to one advantageous embodiment, the source block and the drain block are based on a given semiconductor material, whereas the source block and the drain block are made of another semi-conductor material, different from said given semi-conductor material. The first semi-conducting rods and said second semi-conducting rods can advantageously be made of silicon, whereas said given semi-conductor material, and said other semi-conductor material are chosen from the following materials: N, in particular phosphorus-doped silicon, and P, in particular boron, doped silicon germanium. In particular, the given semi-conductor material and the other semi-conductor materials are adapted in terms of requirements and/or doping to the N or P transistor type desired to be made.

Advantageously, the surrounding gate of the first transistor can be provided distinct and insulated from the surrounding gate of the second transistor. In this case, the gates of the stacked transistors can be biased independently from each other. A gate common to both transistors can alternatively be provided.

According to one advantageous arrangement of the gate of the first transistor, it includes a vertical portion which extends against a first side face of the structure and facing the first semi-conducting rods and the second semi-conducting rods, an insulating zone being arranged between a region of said vertical portion and said side face of said second rods.

According to a particular arrangement of the gate of the second transistor, it includes a vertical part which extends against a second side zone of the structure opposite said first side zone and facing the second semi-conducting rods.

According to another aspect, the present invention relates to a method for making a device such as previously defined.

According to one embodiment of the method, the semi-conducting structure can be formed by etching a stack including alternating semi-conducting layers and sacrificial layers, said one or more first semi-conducting rods and said one or more second semi-conducting rods being made from said semi-conducting layers.

Advantageously, the stack includes:
a lower part with at least one semi-conducting layer and at least one first sacrificial layer,
an upper part with at least one semi-conducting layer and at least one second sacrificial layer,
at least one separation layer between the lower part and the upper part, said separation layer having a thickness higher than said first and second sacrificial layers.

According to one advantageous embodiment, the formation of said source and drain first block and second block of the first transistor can comprise:
forming sacrificial regions on either side of a lower part of the structure, the sacrificial regions being arranged at said ends of said one or more first semi-conducting rods,
forming insulating blocks on the sacrificial regions while preserving a revealed side zone of the sacrificial regions,
removing the sacrificial regions so as to form cavities under the insulating blocks and reveal said ends of said one or more first semi-conducting rods,
epitaxially growing semi-conductor material blocks in said cavities.

The formation of said source and drain third block and fourth block of the second transistor can in turn comprise:
removing a thickness of said insulating blocks on either side of an upper part of the structure and revealing said ends of said one or more second semi-conducting rods, the removal of said thickness being performed so as to free up spaces of the ends of said one or more second semi-conducting rods,
epitaxially growing the semi-conductor material blocks in said spaces.

The method can further comprise, after forming of the first and second block of the first transistor and the third block and fourth block of the second transistor, forming source and drain contact conducting elements for the first transistor. For this, the method can comprise:
forming holes through the third block and the fourth block of the second transistor, the holes revealing the first block and the second block respectively;
forming an insulating sheath on vertical walls of the holes, and then;
depositing conducting material into the holes.

It can also be contemplated to make source and drain contact conducting elements for the second transistor. Advantageously, the method can thereby comprise, after forming the insulating sheath and prior to filling the holes with said conducting material, the steps of:
plugging the holes with a given material;
making second holes revealing the third block and the fourth block of the second transistor respectively;
removing said given material, the deposition of said conducting material being then performed into said holes and said second holes.

According to one embodiment, the gate of the first transistor can be made by:
forming a sacrificial block against a lower region of the structure, the sacrificial block being arranged against the first semi-conducting rod(s);
forming at least one insulating block on said sacrificial block;
forming a well through the insulating block so as to reveal the sacrificial block while preserving a zone of said insulating block against an upper region of the structure in which the second semi-conducting rod(s) is (are),
removing the sacrificial block by etching through the well, so as to reveal the first semi-conducting rod(s);
performing selective etching of the sacrificial layer(s) with respect to the first semi-conducting rods of said stack;
depositing a gate dielectric and a gate material into the well.

The gate of the first transistor may extend against a first side face of the structure. In this case, the formation of said gate of the second transistor can advantageously comprise, in this order:
forming an access hole through an insulating layer disposed against a second side zone of the structure opposite said first side zone, the access hole revealing an upper region of the structure in which the second semi-conducting rod(s) is (are);
performing in said access hole selective etching of the sacrificial layers with respect to the semi-conducting layers of said stack;
depositing a gate dielectric and a gate material into the access hole.

BRIEF DESCRIPTION OF THE DRAWINGS

The present invention will be better understood upon reading the description of exemplary embodiments given by way of purely indicating and in no way limiting purposes, in reference to the appended drawings in which.

Identical, similar or equivalent parts for the different figures bear the same reference numerals so as to facilitate switching from one figure to the other.

The different parts represented in the figures are not necessarily drawn to a uniform scale, to make the figures more understandable.

Further, in the description hereinafter, terms which depend on the orientation of a structure, such as "front", "rear", "upper", "lower", "side", "left", "right", "top", "bottom", "above", "under", etc. are applied considering that the structure is oriented in the illustrated way in the figures.

DETAILED DISCLOSURE OF PARTICULAR EMBODIMENTS

FIGS. 1A-1G are now referred to, giving different 3-dimensional views of a device with stacked transistors as implemented according to a particular embodiment of the present invention.

Figure 1A:
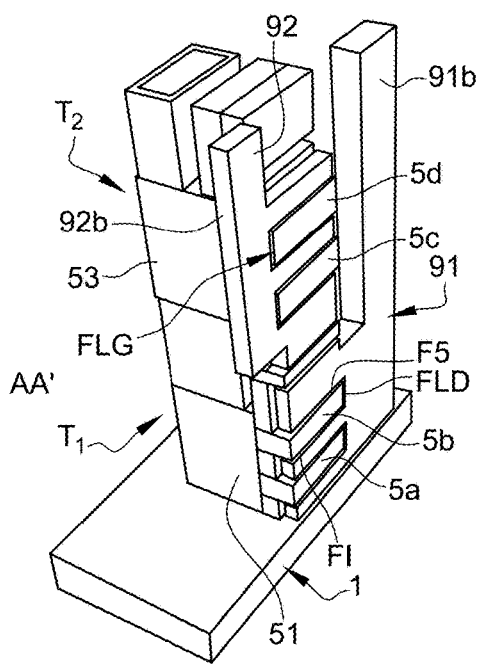
FIGS. 1A-1G are used to illustrate an exemplary embodiment of a device with stacked transistors as implemented according to the invention.
Figure 1B:
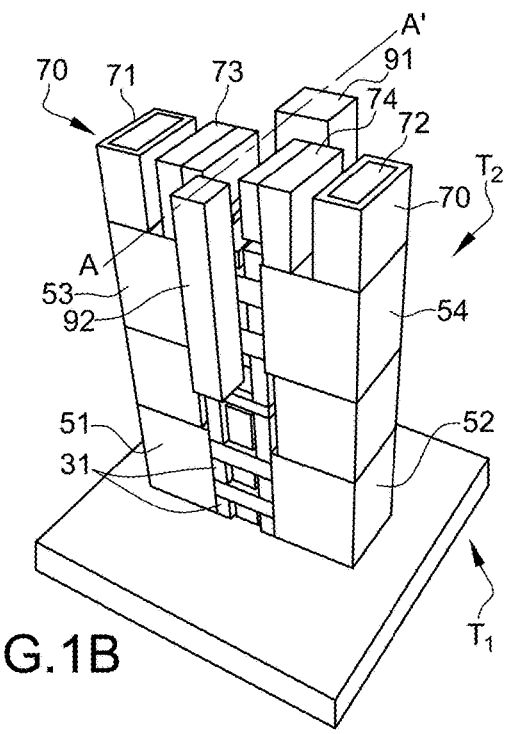
Figure 1C:
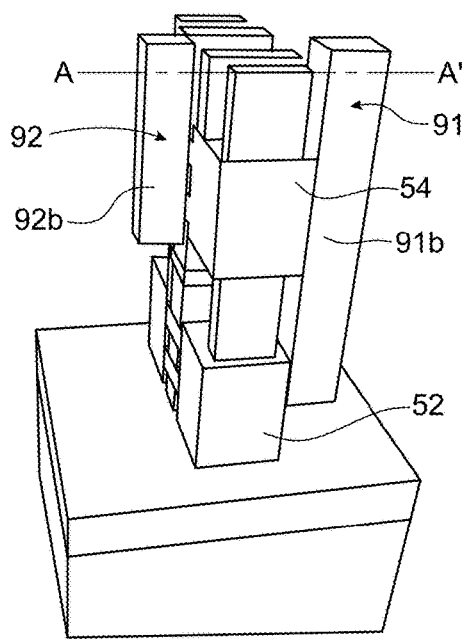
Figure 1D:
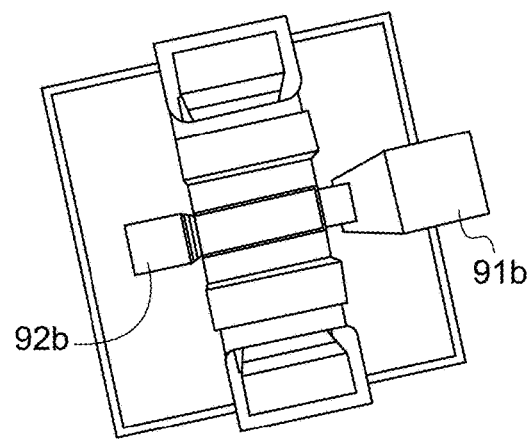
Figure 1E:
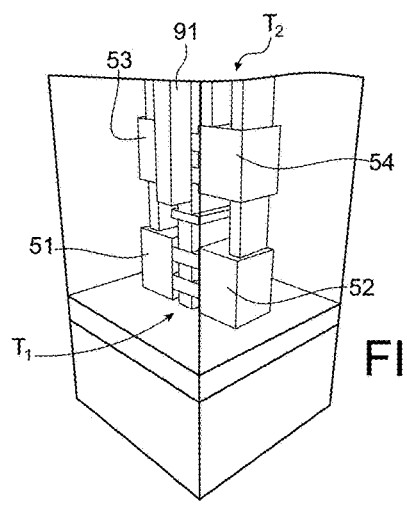

As can be first seen in the cross-section view AA' (cross-section indicated in FIG. 1B) of FIG. 1A, the device lies on a substrate 1 which can be for example a bulk substrate or of the semi-conductor-on-insulator type and includes a transistor $T_1$ of a first type, in this example of the N type. The channel structure of this transistor $T_1$ is formed by k (with k≥1) semi-conducting rods 5a, 5b (k is equal to 2 rods in the particular illustrated exemplary embodiment) also called "nano-wires" or "nano-beams" or "membranes" and which typically have a parallelepipedal shape.

Another transistor $T_2$ of a second type, in this example of the P type, is arranged above the first transistor $T_1$ and has in turn a channel region formed by m (with m≥1 and which can be different from k) rod(s) 5c, 5d.

The semi-conducting rod(s) 5a, 5b of the first transistor $T_1$ and the rod(s) 5c, 5d of the second transistor $T_2$, for example based on silicon, are herein formed in a same structure provided with semi-conducting rods, which are stacked and preferably aligned with each other. This results in space saving and can enable the integration density to be improved with respect to a device with transistors having a similar channel structure but in which the transistor N and the transistor P are juxtaposed to each other.

The lower level transistor $T_1$ is provided with a so-called "surrounding gate" 91 since it extends against an upper face FS of the rods 5a, 5b, against a lower face FI of the rods 5a, 5b opposite the upper face, as well as against at least one side face of the rods 5a, 5b. By "against", it is meant herein facing, since the gate is not directly in contact with the rods because at least one gate dielectric is typically located between the gate and the channel structure.

The surrounding gate 91 extends on one side of the structure with stacked rods, in the exemplary embodiment illustrated on the right side and against the right side face of the rods 5a, 5b.

The upper level transistor $T_2$ is also provided with a surrounding gate 92 which extends against an upper face of the rods 5c, 5d, against a lower face of the rods 5c, 5d as well as against at least one side face of the rods 5c, 5d. To allow space saving, the gate 92 of the upper transistor $T_2$ extends on one side of the structure opposite the one against which the gate 91 of the transistor $T_1$ extends. Thus, in the exemplary embodiment illustrated, the gate 92 on the left side and against a left side face FLG of the rods 5c, 5d, in other words a face opposite the one against which the gate 91 of the lower transistor extends.

Such an arrangement of the gates 91, 92 enables an improved electrostatic control to be achieved and a strong current level to be kept in the respective channel regions of the transistors $T_1$ and $T_2$ while limiting the size.

Such an arrangement also makes it possible to provide transistors $T_1$, $T_2$ with gates 91, 92 independent of each other and which may possibly not be connected to each other. Thus, in the particular illustrated exemplary embodiment, the gate 91 of the bottom transistor $T_1$ is distinct and electrically insulated from the gate 92 of the top transistor $T_2$.

To enable the gates 91, 92 to be biased, they include respective vertical portions 91b, 92b which extend upwardly above the structure, in other words opposite the substrate 1.

Figure 1F:
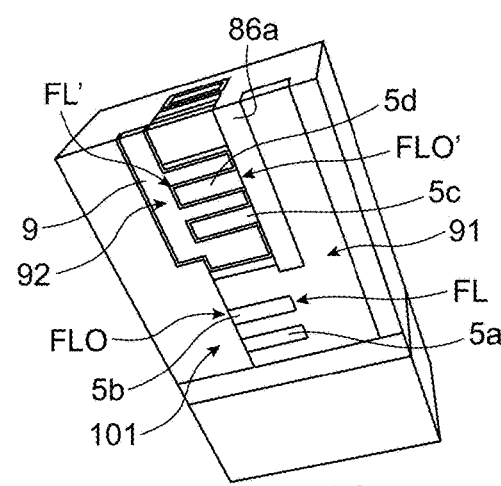

In the view of FIG. 1F (identical to FIG. 8D), which represents the same device illustrated in FIG. 1A, but from another angle of view, the gate 91, of the lower level transistor is arranged against the rods 5a, 5b respectively, and extends against an upper face of the rods 5a, 5b, against a lower face of the rods 5a, 5b and against a side face FL of the rods 5a, 5b, whereas a side face FLO opposite said side face FL is not covered with the gate dielectric or the gate 91 but with a region 101 of insulating material, for example of $SiO_2$. This region 101 of insulating material extends against a side face FLO of each of the rods 5a, 5b of the lower level transistor and against portions of the gate 91 of this transistor. The region 101 of insulating material is herein arranged under the vertical portion 92b of the gate 92 of the upper level transistor.

The gate 92 of the upper level transistor extends in turn against an upper face of the rods 5c, 5d, against a lower face of the rods 5d, 5d and against a side face FL' of the rods 5c, 5d, whereas an opposite side face FLO' of the rods 5c, 5d is not covered with a gate stack, but with a zone 86a of insulating material, for example of $SiO_2$, which extends against the rods 5c, 5d and gate portions 92. The insulating zone 86a is herein arranged between the gate 92 of the upper level transistor and the vertical portion 91b of the gate 91 of the lower level transistor.

The surrounding gates 91, 92 herein make a partial coating for the rods 5a, 5b with an interdigitated comb-shaped structure and a particular arrangement which facilitates the integration of two electrically independent gates while having a limited size. More precisely, each interdigitation of the surrounding gates 91, 92 is fully covering the upper and lower faces of two successive rods, however without covering one of the side faces of each of the rods. In other words, in a cross-section view, each gate 91, 92 has a serrated profile, where each serration (interdigitation) has a dimension equal to the width of a rod (distance separating both side faces of the rod).

Advantageously, the transistor $T_1$ can be also provided with source and drain blocks 51, 52 respectively distinct from the source and drain blocks 53, 54 respectively of the second transistor $T_2$. The source and drain regions of the lower level transistor $T_1$ can also be independently biased from those of the upper level transistor $T_2$. Thus, a source or drain block is typically separated from the upper level drain or source block which is located above, preferably through at least one insulating zone.

The source and drain blocks 51, 52 disposed at the ends of the semi-conducting rods 5a, 5b are typically formed by a semi-conductor material which can be different from that of the rods 5a, 5b and is preferably doped.

For example, the source and drain blocks 51, 52 can be based on boron-doped silicon germanium (SiGe:B) for a P type transistor.

The source and drain blocks 53, 54 disposed at the ends of the semi-conducting rods 5c, 5d can also be formed by a doped semi-conductor material, for example phosphorus-doped silicon (Si:P) for an N type transistor.

For both transistors $T_1$, $T_2$, inner insulating spacers 31 are provided in order to insulate the gates from the source and drain blocks.

To make contact points on the source and drain blocks 51, 52 of the lower transistor $T_1$, conducting elements 71, 72, typically of metal, pass through the source and drain blocks 53, 54 of the upper level transistor $T_2$. The conducting elements, also called studs 71, 72, are surrounded on at least one portion passing through the source and drain blocks 53, 54 of the transistor $T_2$ by an insulating sheath or jacket 70, for example of silicon nitride. This makes it possible to make a contact on the source or drain block of the lower level transistor $T_1$ independent of the source or drain block of the upper transistor through which it passes, in other words without being electrically connected to this upper level block through which it passes. Such an arrangement also enables the size of the device to be improved.

Other conducting elements or studs 73, 74, which are vertical and typically of metal make it possible to make a contact point on the source and drain blocks 53, 54 of the upper level transistor $T_2$. In this exemplary embodiment, the conducting elements or studs 73, 74, of the lower level transistor are thus distinct and insulated from the conducting elements or studs 71, 72 of the upper level transistor.

Figure 1G:
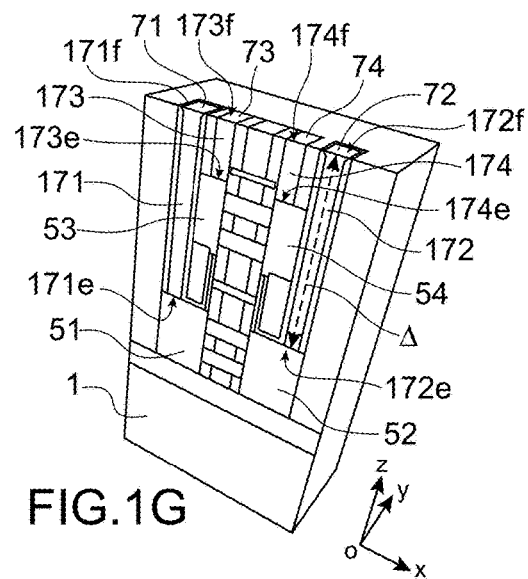

FIG. 1G (identical to FIG. 6G) illustrates the conducting elements 71, 72, 73, 74 in contact respectively with the source block 51 of the lower level transistor, the drain block 52 of the lower level transistor, the source block 53 of the upper level transistor, the drain block 54 of the upper level transistor.

The conducting elements 71, 72, 73, 74 are each formed by a vertical conducting portion having an end in contact with a source or drain block. Thus, the conducting element 71, the conducting element 72, the conducting element 73, et the conducting element 74 each have an end 171f, 172f, 173f, 174f located above the substrate and the semi-conducting structure of stacked rods 5a, 5b, 5c, 5d, and another end 171e, 172e, 173e, 174e in contact with a source or drain block. All the conducting elements 71, 72, 73, 74 each extend between these two ends along a same main axis of extension Δ without changing direction along this main axis of extension Δ. The main axis of extension Δ is herein an axis orthogonal to a horizontal plane of the substrate 1 in other words a plane passing through the substrate and parallel to a plane [O;x;y] of an orthogonal reference frame [O;x;y;z]. The main axis of extension Δ is thus herein a vertical axis, parallel to a given axis z in FIG. 1G.

It is to be noted that all the vertical conducting portions (herein in the number of four), respectively of all the conducting elements 71, 72, 73, 74 (herein four), all extend in a same plane [O;x;z], in addition to all extending along axes of extension parallel to the main axis Δ.

Additionally, as illustrated in FIG. 1G, the stack of the transistors $T_1$, $T_2$ and their vertical conducting portions have a perfect axial symmetry along a vertical axis passing through the middle of the rods.

The advantage of such an arrangement of the conducting elements 71, 72, 73, 74 is to be compact and to facilitate contact points.

The exemplary embodiment which is represented in FIGS. 1A-1G provides a structure with 4 stacked semi-conducting nanowires and 2 nanowires per transistor. To increase the current level per unit area, it is possible to increase the number of stacked nanowires. It is also possible, as suggested above, to provide a different number of nanow-ires between both stacked transistors. Additionally, in this example, a P type transistor is located under an N type transistor. It is also possible to provide a reverse configu-ration in which the N type transistor is located under the P type transistor.

Figure 2:
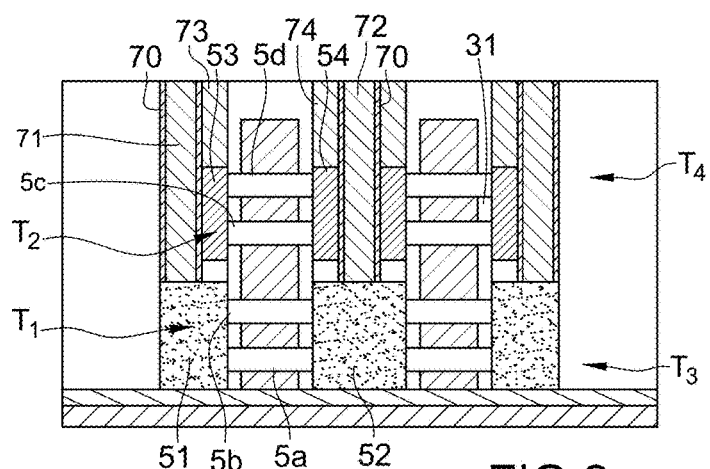
FIG. 2 is used to illustrate an exemplary embodiment with several juxtaposed transistors distributed on two levels.

In the particular exemplary embodiment illustrated in FIG. 2, besides the transistors the structure of which has been previously described, other stacked transistors $T_3$, $T_4$ of different types, for example P and N, are provided. The transistors $T_3$, $T_4$ are herein also provided with distinct source and drain semi-conducting blocks. A lower level transistor $T_3$ shares with the transistor $T_1$, a common source or drain semi-conducting block. The transistors $T_3$, $T_4$ are also provided with channel regions made in a structure with semi-conducting rods disposed above each other. This struc-ture may have been made in a same layer stack as the one including the rods 5a, 5b, 5c, 5d forming the respective channel regions of the transistors $T_1$, $T_2$.

An exemplary method for making a device with stacked transistors of the type of either of those previously described will now be described in connection with FIGS. 3A-3C, 4A-4D, 5A-5T, 6A-6G, 7A-7I, 8A-8D.

A possible starting material for this exemplary method is in the form of a semi-conductor-on-insulator type substrate 1, for example of the SiGeOI (silicon germanium on insu-lator) type, which includes a semi-conducting support layer 2, an insulating layer 3 and which is disposed on and in contact with the support layer 2 and a surface semi-con-ducting layer 4 disposed on and in contact with the insulat-ing layer 3.

The surface semi-conducting layer 4 is made of a first semi-conductor material which, in this example, can be silicon germanium. Such a surface layer 4 can for example be implemented from an SOI (silicon on insulator) type substrate provided with a surface layer of silicon which is enriched with Germanium.

The insulating layer 3 of the substrate can in particular be a BOX ("Burried Oxide") type layer based on an insulator such as $SiO_2$. A BOX layer with a thickness $e_3$ between for example 20 nm and 145 nm can be provided.

Figure 3A:
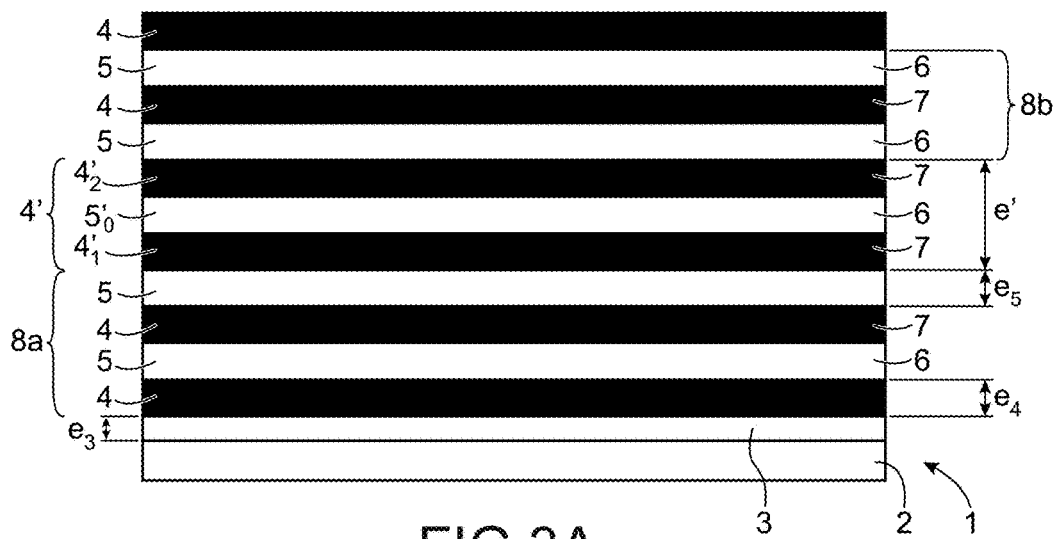
FIGS. 3A-3C are used to illustrate an exemplary embodiment of a stack from which respective channel regions of the stacked transistors are to be formed.

Other layers are then formed on the surface semi-con-ducting layer 4 so as to make a stack which includes alternating sacrificial layers 4 and semi-conducting layers 5 (FIG. 3A). In the particular exemplary embodiment illus-trated in FIG. 3A, the surface semi-conducting layer 4 of the substrate is led to be used as a sacrificial layer.

The stack is comprised of a lower part 8a with one or more sacrificial layer(s) 4 and one or more semi-conducting layers 5 provided to accommodate a channel region of a first transistor. The stack is also comprised of an upper part 8b with one or more sacrificial layer(s) 4 and one or more semi-conducting layers 5 provided to form a channel region of a second transistor disposed on the first transistor.

The sacrificial layers 4 are made of a material that can be selectively etched with respect to that of the semi-conduct-ing layers 5, for example a first semi-conductor material 6. In the case, for example, where the semi-conducting layers 5 are made of Si, the sacrificial layers 4 can be formed of $Si_{1-x}Ge_x$ with x for example between 0.2 and 0.45. To be able to achieve a proper etching selectivity of $Si_{1-x}Ge_x$ relative to Si, a concentration of Ge higher than or equal to 30% is preferably chosen.

A separation layer 4' is also provided between the lower part 8a and the upper part 8b of the stack. The separation layer 4' can be provided to make an insulation between the channel region of the lower level transistor and the channel region of the upper level transistor. The separation layer 4' can be formed by the same material as that of the sacrificial layer 4 but with a higher thickness. In the case where the separation layer 4' is made of a material adapted to stress that of the semi-conducting layers 5 between which it is located, the thickness e' is preferably limited so as to avoid a relaxation of these layers 5.

For example, the thickness e' can be between 5 nm and 40 nm for a layer 4' of $Si_{0.7}Ge_{0.3}$.

Figure 3B:
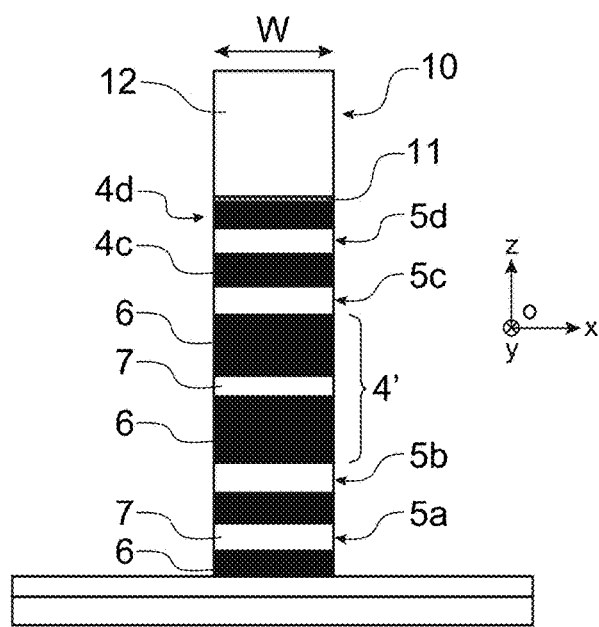
Figure 3C:
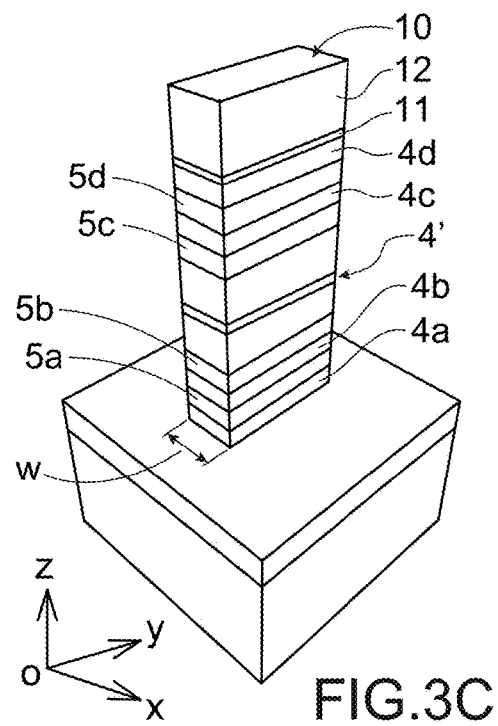
Figure 4A:
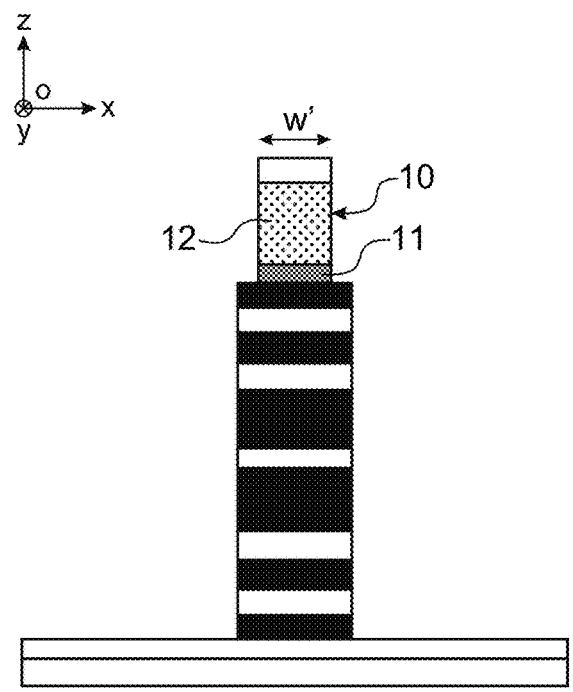
FIGS. 4A-4D are used to illustrate an exemplary embodiment of insulating inner spacers.
Figure 4B:
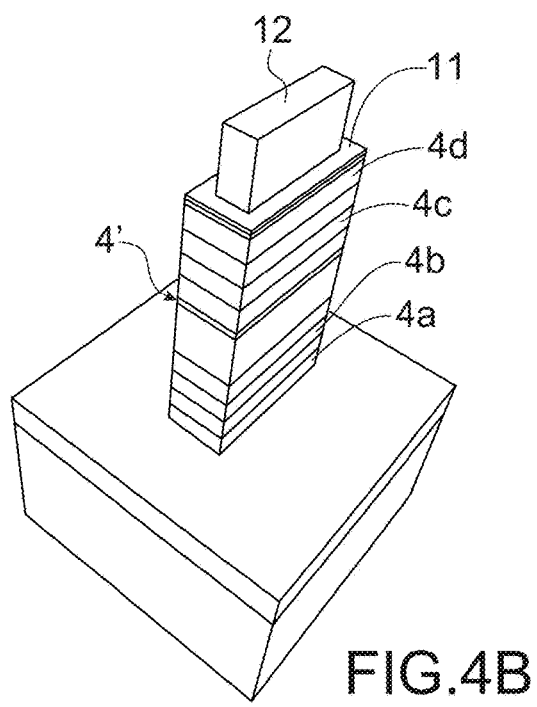
Figure 4C:
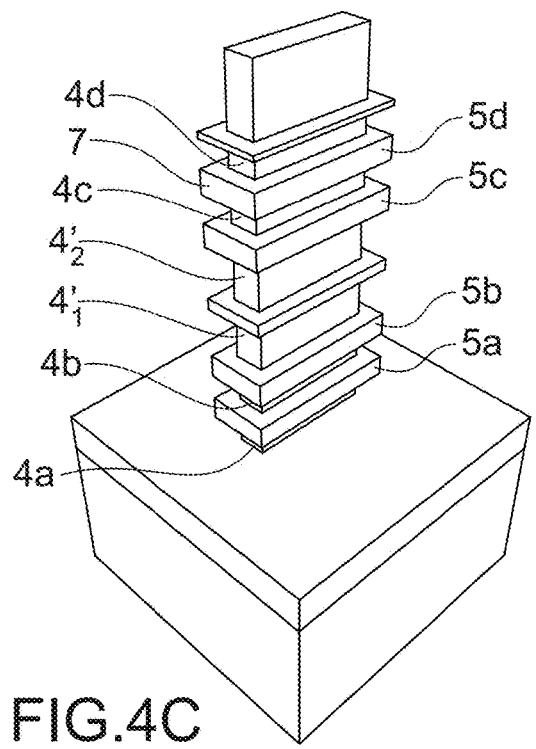
Figure 4D:
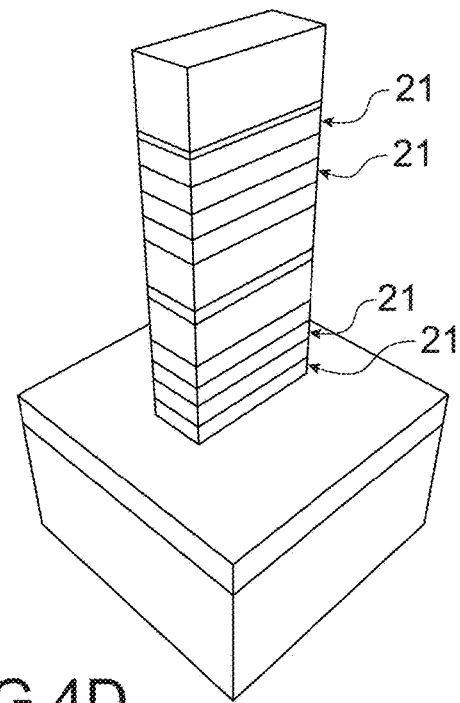

In the particular exemplary embodiment illustrated in FIG. 3C, the separation layer 4' is formed by a stack of several layers and in particular including a semi-conducting layer $5'_0$ based on the second semi-conductor material 7 disposed between sacrificial layers $4'_1$, $4'_2$ based on the first semi-conductor material 6, here used as a sacrificial material.

The stack which, in this exemplary embodiment, is comprised of semi-conducting layers 4, 5 is typically formed by successive epitaxies or multi-layer epitaxy. The layers 4 based on the first semi-conductor material 6 can have a thickness $e_4$ for example between 5 and 25 nanometres, for example in the order of 10 nm. The layers 5, based on the second semi-conductor material 7 can be provided with a thickness $e_5$ for example between 5 and 25 nanometres, for example in the order of 10 nm.

Once the stack is made, a mask 10 is formed on this stack. The mask 10 may comprise a hard mask 12, for example of silicon nitride. The thickness of the hard mask 12 can be chosen taking subsequent CMP polishing steps into account. For example, a hard mask 12 with a thickness between 30 nm and 150 nm can be made. The mask 10 formed can also comprise a protection layer 11 interposed between the semi-conducting stack and the hard mask 12. For example, such a protection layer 11 based on $HfO_2$ or $SiO_2$ and with a thickness in the order of 3 nm to 10 nm is provided.

The width of the mask 10 is chosen depending on that noted W of the patterns desired to be made in the stack.

The layers 4, 5, 4' are then etched, preferably anisotropically and so as to make a stack of rods 4a, 5a, 4b, 5b, 4', 5c, 4c, 5d, 4d also called nano-wires. The rods have a width W which can be for example between several nanometres and several tens nm, for example in the order of 25 nm. In the example of FIGS. 3B and 3C (giving respectively a transverse cross-section view and a perspective view) W is measured in a direction parallel to the main plane of the substrate. The main plane of the substrate is defined as a plane passing through the substrate and parallel to the plane [O; x; y] of an orthogonal reference frame [O; x; y; z] given in FIGS. 3B and 3C.

After the width of the channel structure has been defined, insulating inner spacers can be formed.

For this, a contraction of the hard mask 12 is then performed (FIGS. 4A and 4B), so as to reduce its dimensions and in particular its width (measured in parallel to that W of the rods). For this, an isotropic etching is typically made, for example etching using $H_3PO_4$ when the hard mask 12 is made of silicon nitride. The contraction performed can be in the order of the spacer size, for example in the order of 10 nm. A hard mask with a width W', for example in the order of 15 nm is thus obtained.

Then (FIG. 4C), a partial selective etching of the rods 4a, 4b, 4c, and the sacrificial layers $4'_1$, $4'_2$ is made in the stack 4' formed based on the first semi-conductor material 6. Thus, the side dimensions of these rods 4a, 4b, 4c, 4d are reduced while preserving the rods 5a, 5b, 5c, 5d formed based on the second semi-conductor material 7. In the case for example where the first semi-conductor material 6 is based on silicon germanium, an acid solution based on $HF+H_2O_2$ can be employed. The etching duration is adapted depending on the desired dimension reduction and advantageously so as to make a reduction of the rods 4a, 4b, 4c, 4d of sacrificial material corresponding to that made on the hard mask 12.

The selective etching of the first semi-conductor material 6 can be made so as to obtain rods 4a, 4b, 4c, 4d based on the first semi-conductor materials with side dimensions (dimensions measured in parallel to the plane [O;x;y]) substantially equal to those of the hard mask 12. By "substantially equal", it is meant herein they differ by less than 10 nm. Thus, the rods 4a, 4b, 4c, 4d with reduced dimensions are aligned with the hard mask 12.

Then (FIG. 4D), insulating plugs 21 also called inner spacers are made around the rods 4a, 4b, 4c, 4d based on the first semi-conductor material 6 the side dimensions of which have been previously reduced. These insulating plugs 21 fill spaces resulting from the partial removal of the rods 4a, 4b, 4c, 4d. The insulating plugs 21 can be formed by depositing and then etching an insulating material usually used to make spacers such as silicon nitride or a "low-k" dielectric such as for example SiBCN or SiOCN. Etching insulating material can be made for example based on diluted $H_3PO_4$.

After the inner insulating spacers are made, the source and drain blocks can be formed for the stacked transistors.

Figure 5A:
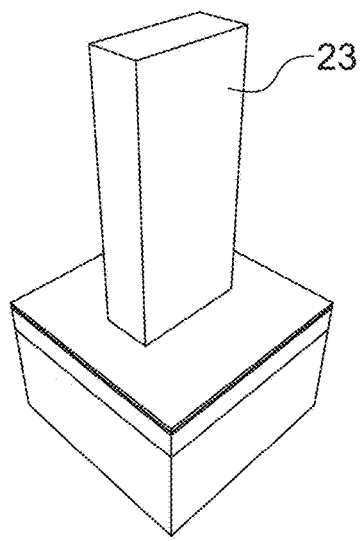
FIGS. 5A-5T are used to illustrate an exemplary embodiment of source and drain regions for each of the stacked transistors.

For this, in the exemplary embodiment illustrated in FIG. 5A, a fine protection, preferably insulating layer 23 is advantageously formed. This fine layer 23 is for example made of silicon oxide TEOS, with a thickness for example in the order of 4 nm.

Sacrificial regions are then made. These sacrificial regions are to define locations of the source and drain blocks, in particular for the lower transistor, that is the one formed at the lower part 8a of the structure with semi-conducting rods disposed above each other.

Figure 5B:
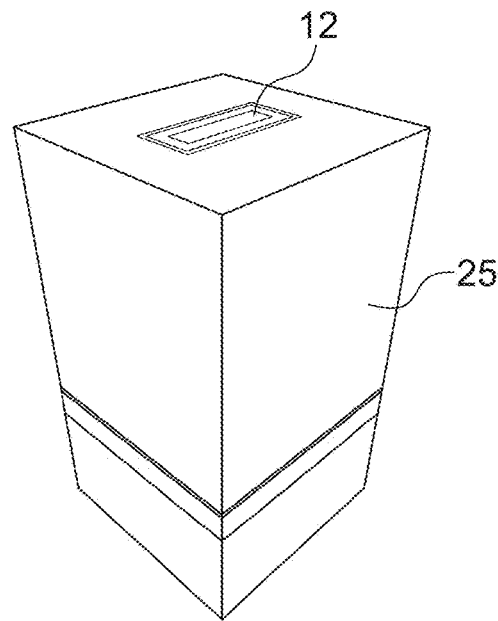

Making the sacrificial regions can comprise depositing a material 25 for example such as polysilicon or amorphous silicon, and then polishing, for example by CMP with a stop on the hard mask 12 (FIG. 5B).

Then, patterns are formed in the material 25 dimensions of which measured in parallel to the main plane of the substrate (in other words a plane passing through the substrate and parallel to the plane [O;x;y]) substantially correspond in this exemplary embodiment, to within the thickness of the fine layer 23, to those desired to be provided to the sacrificial regions.

Figure 5C:
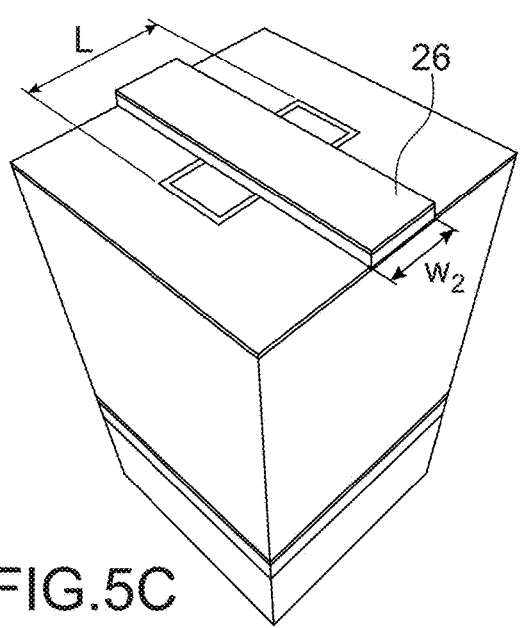

For this, a lithography can be performed through a masking 26, for example based on a photo resist. In the particular exemplary embodiment illustrated in FIG. 5C, the masking 26 is oriented orthogonal to the rods taken in the direction of their length L and is chosen with dimensions, in particular a width $W_2$ lower than the length L of the rods of the structure. The structure is thus not fully covered by the masking 26 and portions of the structure with stacked rods are not located facing the masking 26.

Figure 5D:
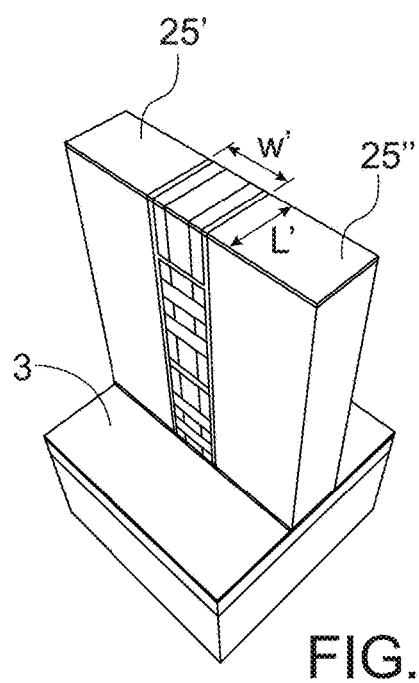

A preferably anisotropic etching of the material 25 is then made. In the illustrated example, in FIG. 5D, because of the choice of the dimensions and in particular of that of the width $W_2$ of the masking 26, this etching herein makes it possible, besides the formation of patterns to form regions 25', 25" in the material 25, to remove portions of the stack and reduce the length L of the bars by etching portions of respective ends of these rods. The etching can be made for example using $HBr/O_2/Cl_2/CF_4$ and can be extended until it reaches the insulating layer 3 of the substrate.

Figure 5E:
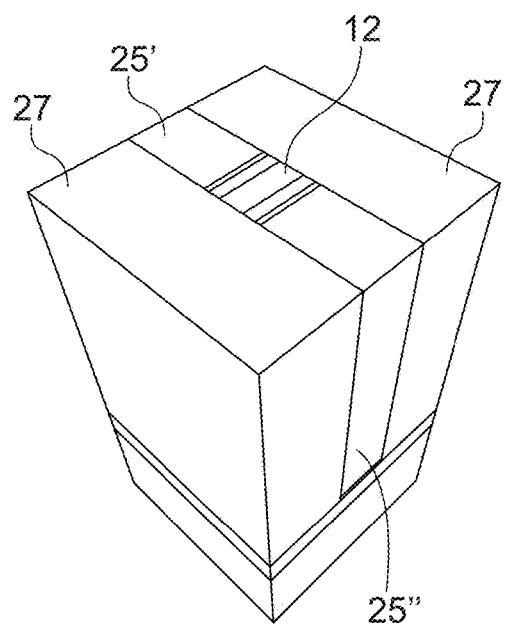

Then, encapsulation insulating blocks 27 are formed on either side of the regions 25', 25" and of the structure formed with the stacked rods (FIG. 5E). Making these insulating blocks 27 comprises depositing an insulating material, typically silicon oxide $SiO_2$, so as to cover the structure of stacked rods and the regions 25', 25", and then by CMP polishing so as to reveal the top of the structure which, in the illustrated example, is still coated with the hard mask 12 and the regions 25', 25".

Figure 5F:
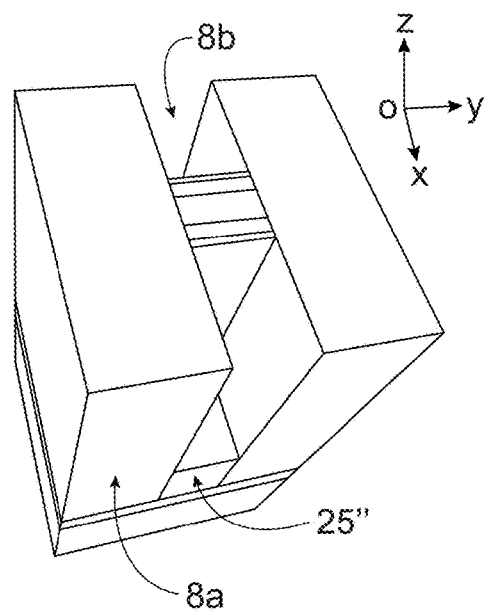

A partial etching of the regions 25', 25" is then performed. A thickness, in other words a height (dimension measured in parallel to the axis z) of material 25 is in particular removed at the upper part 8b of the structure of stacked rods (FIG. 5F). The material 25 is kept at the lower part 8a of the structure. A thickness at least equal to the height $h_1$ (dimension given in FIG. 3B) at which the upper face of the highest rod 5b of the lower part 8b of the structure is located is typically kept. For example, the thickness of the regions 25', 25" can be in the order of 55 nm.

In this case where the material 25 of the regions 25', 25" is polysilicon, this etching can be made for example using TMAH or TEAH.

Figure 5G:
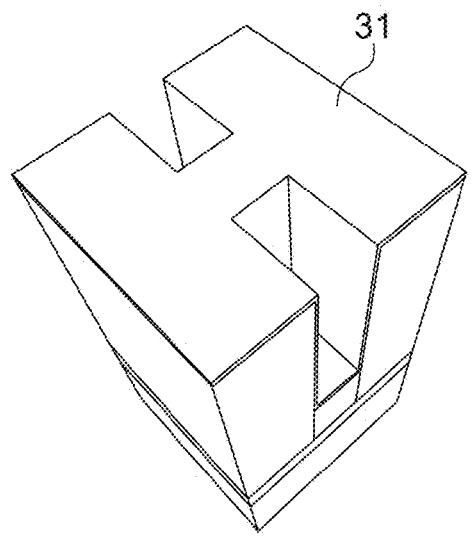

Advantageously, a separation insulating layer 31 is then made so as to cover the regions 25', 25" as well as the structure with stacked rods (FIG. 5G). This insulating layer 31 is for example based on nitride with a typically conformable thickness. The insulating layer 31 has for example a thickness in the order of 6 nm.

Figure 5H:
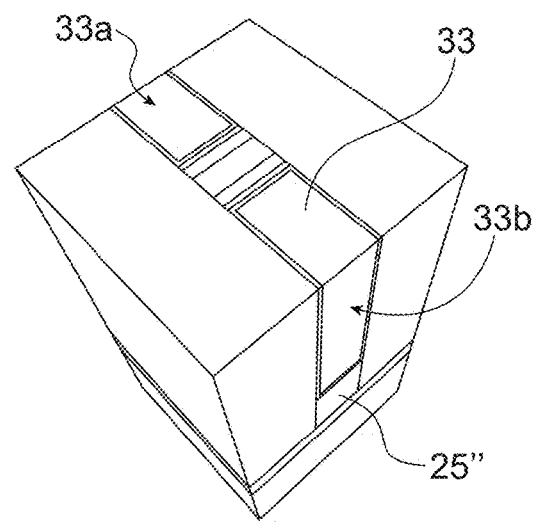

Interstices formed by partially removing a thickness of the regions 25', 25" are then filled by depositing a material 33, in order to make insulating blocks 33a, 33b. The material 33 is preferably an insulating material chosen so that it can be selectively etched with respect to that of the separation insulating layer 31. The material 33 can in particular be the same as that of the insulating blocks 27, for example based on silicon oxide. This deposition can be followed by a planarisation (CMP) step, so as to remove the insulating separation layer 31 at the top of the structure and reveal again the hard mask 12 (FIG. 5H).

Figure 5I:
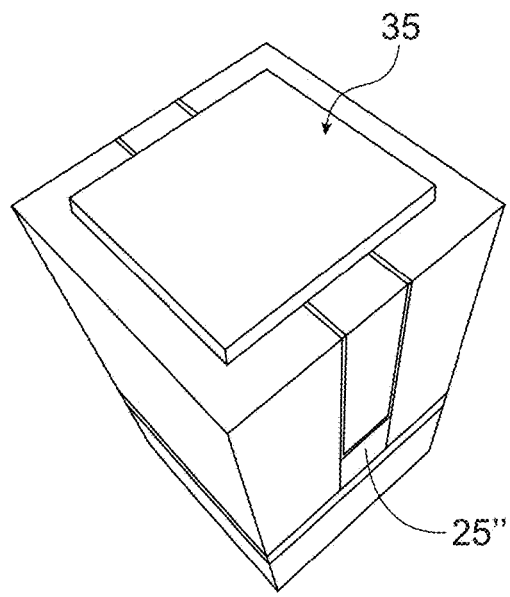
Figure 5J:
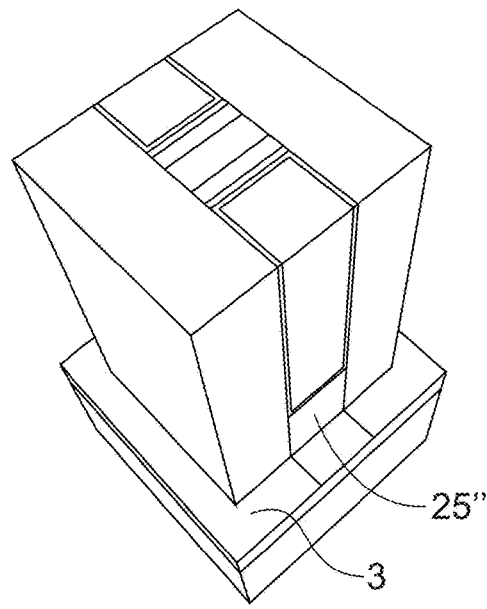

The insulation of the structure or cell formed by an NMOS transistor and a PMOS transistor is then performed by etching the whole while protecting using a mask 35 the stack and parts of the insulating blocks 27, blocks of insulating material 33 and the regions 25', 25". In the exemplary embodiment illustrated in FIGS. 5I-5J, the mask 35 has a rectangular shape and fully covers the stacked semi-conducting structure. The etching can be made until it reaches the insulating layer 3 of the substrate, and allows access to the regions 25', 25", in particular to a side zone 25a of these regions 25', 25".

Figure 5K:
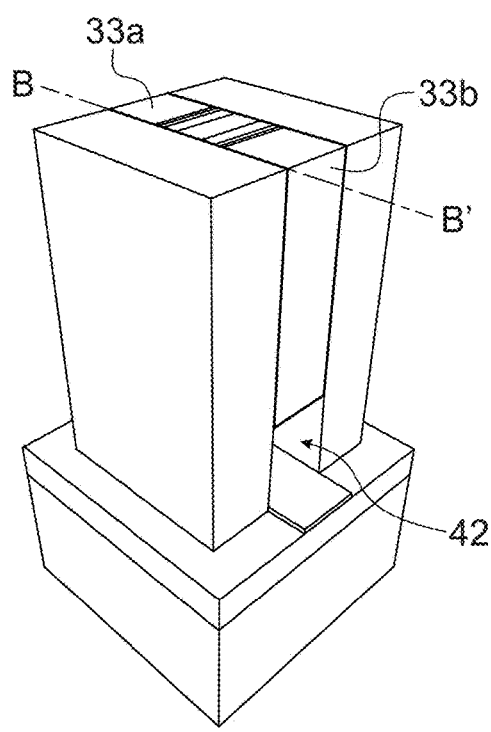
Figure 5L:
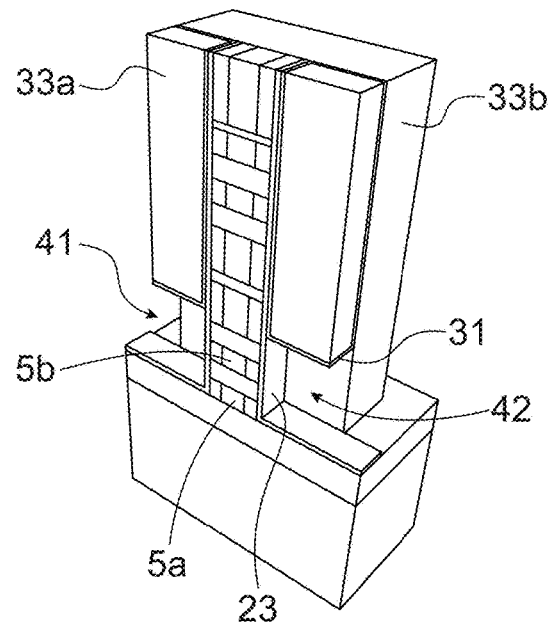
Figure 5M:
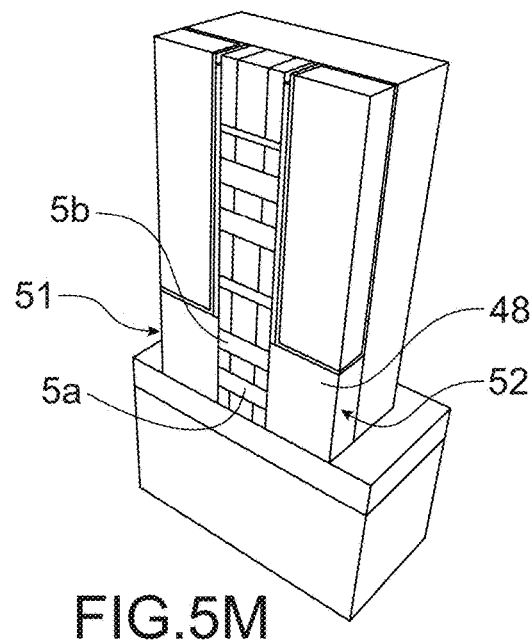

A selective etching of the regions 25', 25" of the material 25 is then performed so as to free up cavities 41, 42 located under the insulating blocks 33a, 33b (FIGS. 5K and 5L respectively giving a perspective view and a partial perspective view in a cross-section BB'). When the material 25 is polysilicon, this selective etching can for example be made using TMAH or TEAH.

In the case where a fine protection layer 23 coats the structure, this layer 23 is also removed. The cavities 41, 42 thereby reveal ends of the first semi-conducting rods 5a, 5b, at the lower part of the structure. The separation layer 31 forms an upper wall of these cavities 41, 42 and thus enables the cavities 41, 42 to be precisely delimited.

A semi-conductor material 48 is then epitaxially grown in the cavities 41, 42. The semi-conductor material 48 is advantageously doped in situ during this epitaxy growth step. The growth of the semi-conductor material 48 enables source and drain blocks 51, 52 to be formed for the lower level transistor. The material 48 can be for example SiGe:B, in particular in the case where the lower level transistor is of the PMOS type. The other parts of the structure are in turn protected during epitaxy, which enables semi-conductor material to be grown only at the lower part of the structure.

Source and drain blocks can then be formed for the upper level transistor.

Figure 5N:
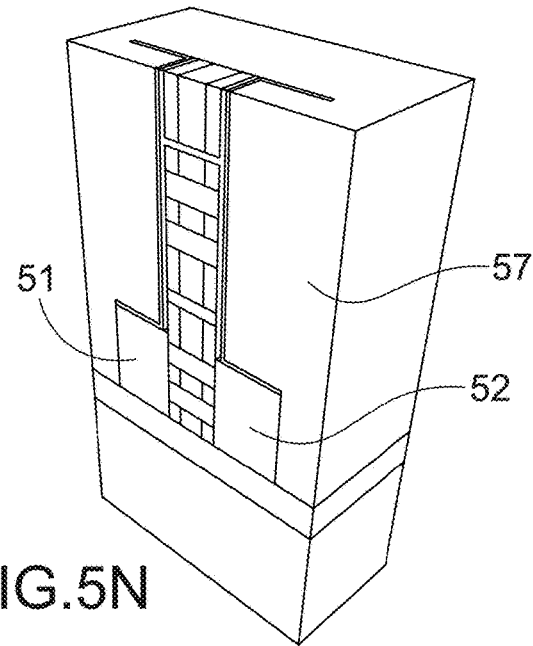

For this, an insulating layer 57, for example based on silicon oxide can be deposited beforehand, so as to cover and protect the source and drain blocks 51, 52 of the lower level transistor (FIG. 5N). The deposition can be followed by a CMP planarisation.

Figure 5O:
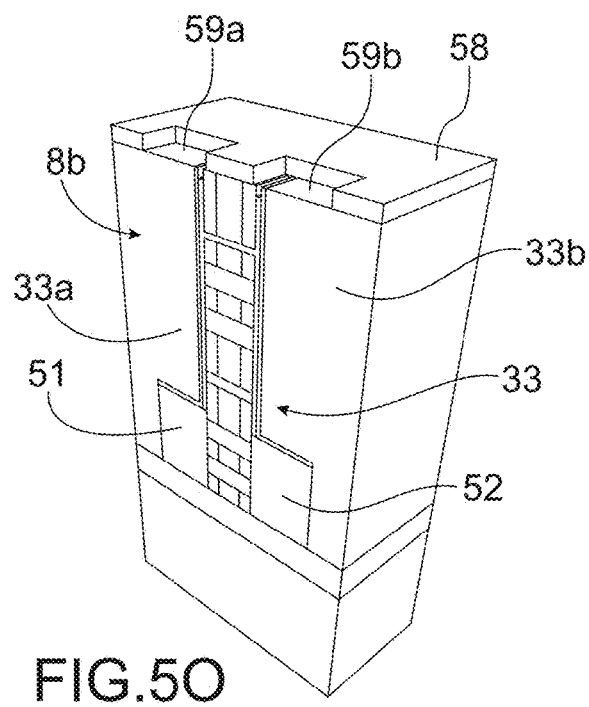
Figure 5P:
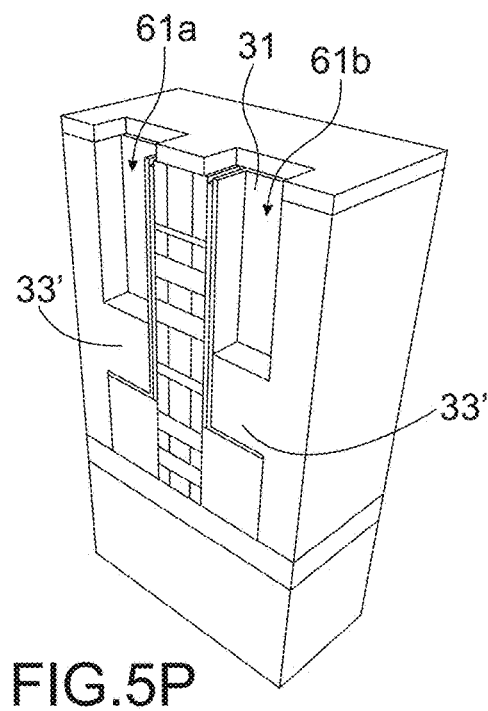

A thickness of the blocks 33a, 33b of insulating material 33 which are arranged on either side of an upper part 8b of the structure is then removed. To perform this removal, a method illustrated in FIGS. 5O-5R comprises forming a masking 58. This masking can be made from a photolithography resolving resin provided with openings 59a, 59b located on either side of the structure (FIG. 5O), and removing by etching a layer of insulating material 33 through the openings 59a, 59b. Thus, spaces 61a, 61b are freed up on either side of the structure and which are located in this exemplary embodiment above and facing respectively source 51 and drain 52 blocks of the lower transistor (FIG. 5P). The etching of the insulating material 33 can be made for example using $C_4F_6/O_2$ and so as to keep portions 33' of insulating material between the source and drain blocks 51, 52 and the spaces 61a, 61b.

Figure 5Q:
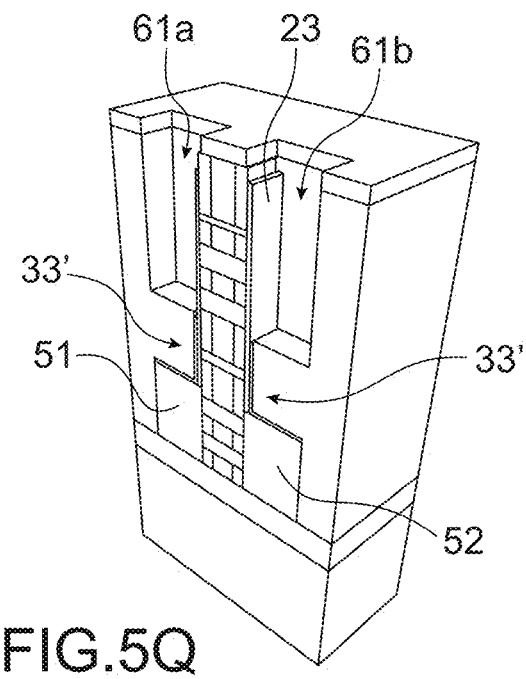
Figure 5R:
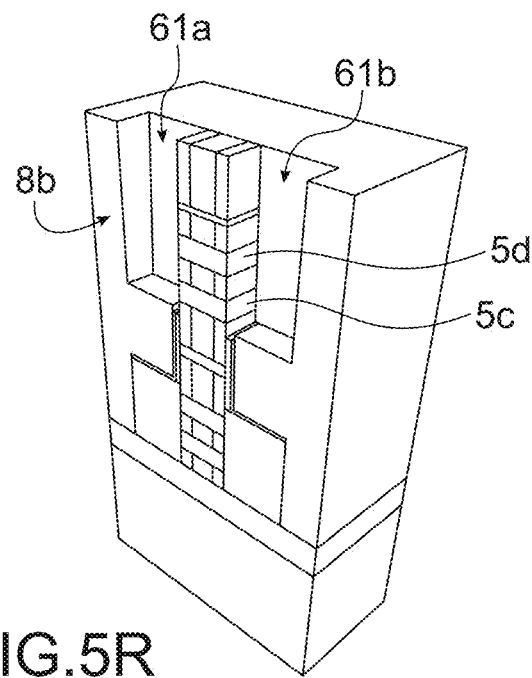

Then, in the case where a separation layer 31 has been made, this layer is removed in the spaces 61a, 61b (FIG. 5Q). This removal is for example performed using diluted $H_3PO_4$ (100° C.) when the separation layer 31 is made of silicon nitride.

In the case where the upper part 8b of the structure is also covered with the fine protection layer 23, this fine protection layer 23 is then also removed in the spaces 61a, 61b. This removal is for example performed using a HF based solution when the protective separation layer 23 is made of silicon oxide TEOS.

The spaces 61a, 61b thereby reveal ends of the second semi-conducting rods 5c, 5d, at the upper part 8b of the structure.

Figure 5S:
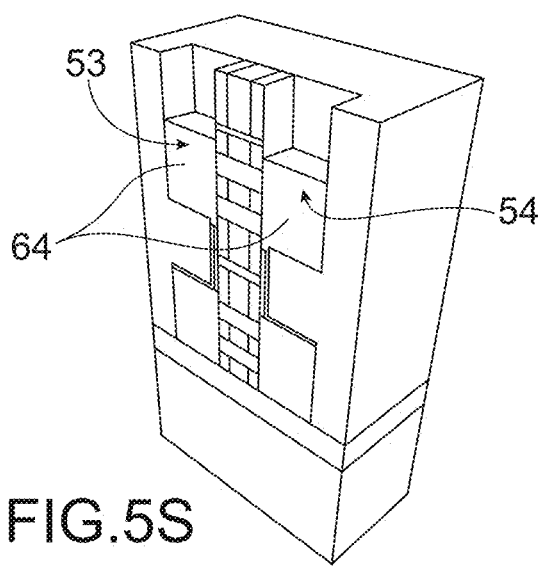

A semi-conductor material 64 is then epitaxially grown (FIG. 5S) into the spaces 61a, 61b. The semi-conductor material 64 can be doped in situ during the epitaxy growth step. The growth of the semi-conductor material 56 enables source and drain semi-conducting blocks 53, 54 to be formed for the upper level transistor. The material 64 can be for example Si:P, in particular in the case where the upper level transistor is of the NMOS type. The other parts of the structure are in turn protected during epitaxy.

Figure 5T:
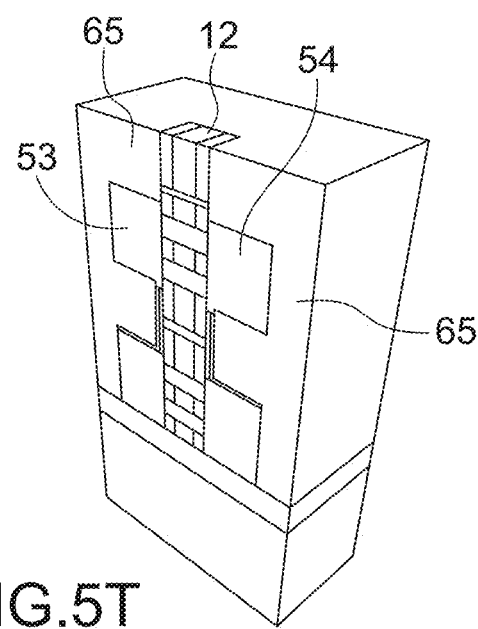

An insulating layer 65, for example based on silicon oxide can then be deposited, so as to cover and protect the source and drain blocks 53, 54 of the upper level transistor. This deposition is typically followed by a CMP planarisation with a stop on the hard mask 12 (FIG. 5T).

An exemplary method for making contact elements for the source and drain blocks of stacked transistors will now be described in connection with FIGS. 6A-6F.

Holes 69a, 69b are first formed through the source semi-conducting block 53 and the drain semi-conducting block 54 of the upper level transistor, the bottom of which respectively reaches the source block 51 and the drain block 53 of the lower level transistor.

Figure 6A:
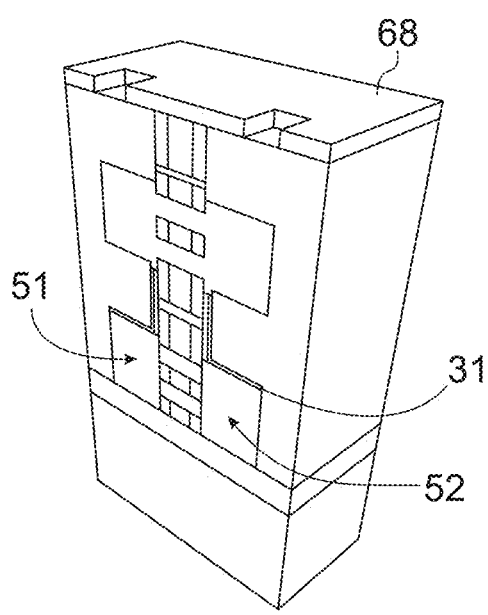
FIGS. 6A-6G are used to illustrate an exemplary embodiment of source and drain contact elements for each of the stacked transistors.

For this, as illustrated in FIG. 6A, a mask 68 can be made, for example based on a resolving resin (conventional lithography) including openings through which an etching is performed to form the holes 69a, 69b. This etching can be made with a stop on the separation insulating layer 31, for example of silicon nitride. When this separation insulating layer 31 is present, it is then removed so as to reveal the source and drain semi-conducting blocks 51, 53.

Figure 6B:
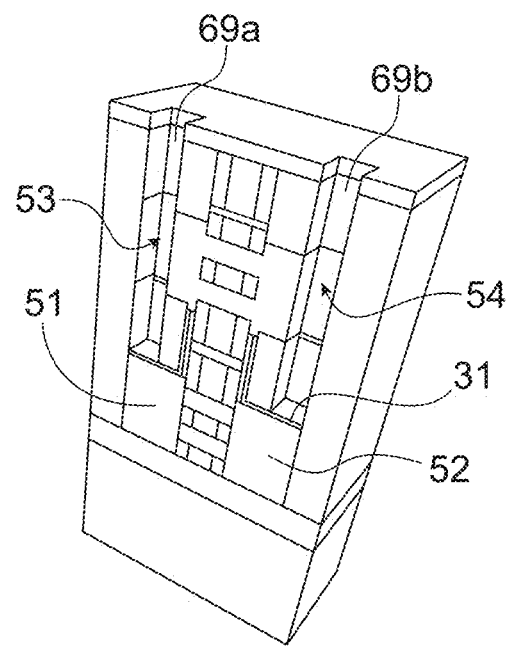
Figure 6C:
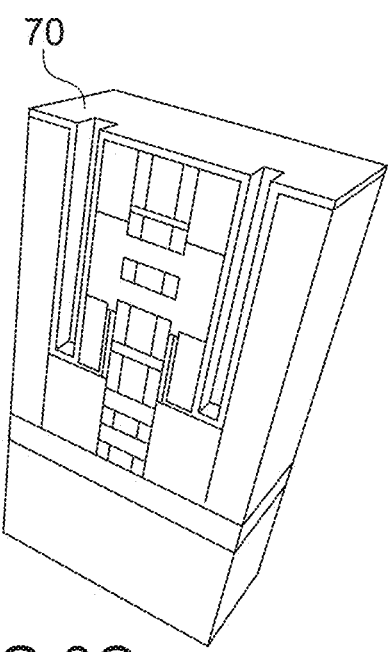

This removal is typically made using $C_4F_6/O_2$ when the separation layer 31 is made of silicon nitride (FIG. 6B).

An insulating material 70 is then deposited (FIG. 6C) into the holes 69a, 69b. The insulating material 70 can be the same as that of the separation layer 31, for example of silicon nitride. This insulating material 70 enables an insulating jacket or insulating sheath to be made at the vertical walls of the hole. Such an insulating sheath with a thickness for example between 2 nm and 10 nm, is provided to enable the contacts desired to be made with the source and drain blocks of the bottom transistor to be insulated from, the source and drain blocks of the top transistor and which contacts these are made to pass therethrough.

Figure 6D:
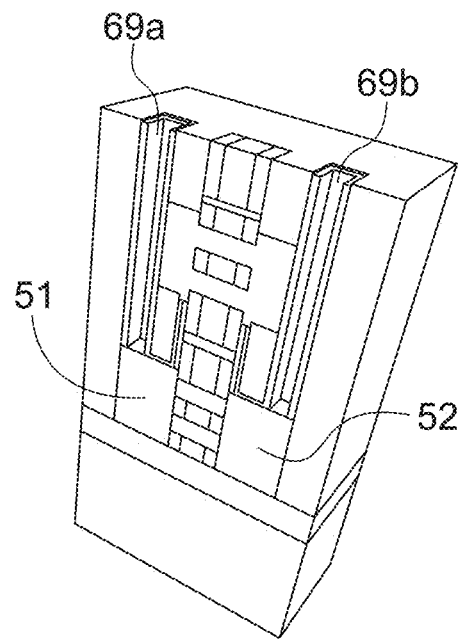
Figure 6E:
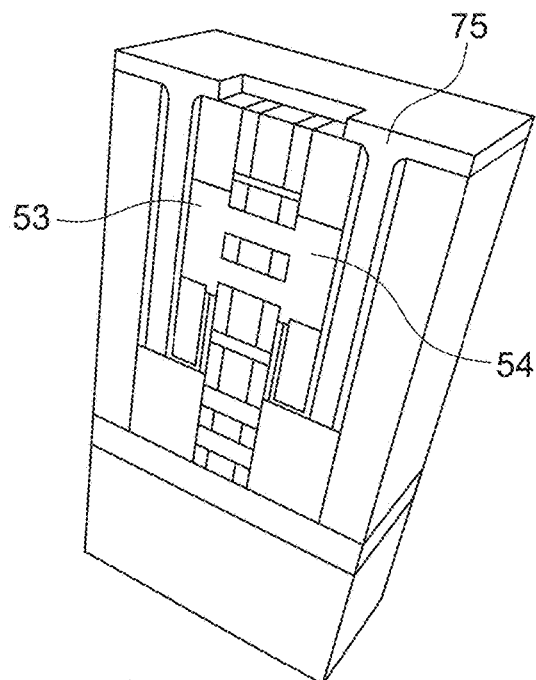
Figure 6F:
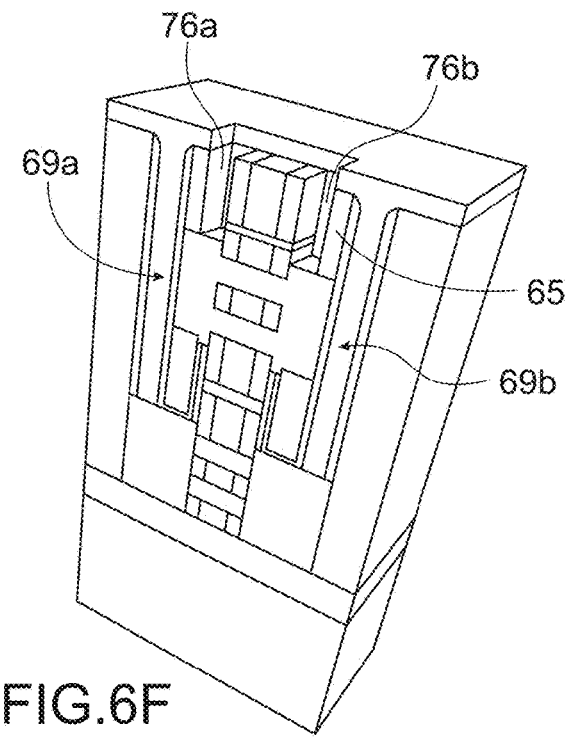

An anisotropic etching, for example using $CH_3F/O_2/He/CH_4$ when the material 70 is made of silicon nitride, can then be made in order to remove this material 70 at the bottom of the holes 69a, 69b and reveal the semi-conducting blocks 51, 52 (FIG. 6D). Such an etching can also be made outside the mouth of the holes.

Filling the holes 69a, 69b with a conducting material for example a metal material and based on TiN and tungsten that will then be planarised can then be performed. According to a particular embodiment illustrated in FIGS. 6E-6G, where it is desired to form the conducting material of the source and drain block contacts of the lower transistor at the same time as that of the source and drain contacts of the upper transistor, a plugging of the holes 69a, 69b with a given material 75, for example TiN and tungsten is then performed.

An opening is then provided in this material 75, which extends facing the structure and the semi-conducting blocks 53, 54 of the upper transistor. An etching is then performed through this opening to make holes 76a, 76b respectively revealing the source semi-conducting block 53 and the drain semi-conducting block 54 of the upper level transistor. The holes 76a, 76b can be made by lithography (resolving resin) in particular when the purpose is to etch the insulating layer 65 typically of silicon oxide.

A selective removal of said given material is then performed in order to unplug the holes 69a, 69b and reveal again the semi-conducting blocks 51, 52. Such a removal can be performed using for example $C_4F_6/O_2$.

Figure 6G:
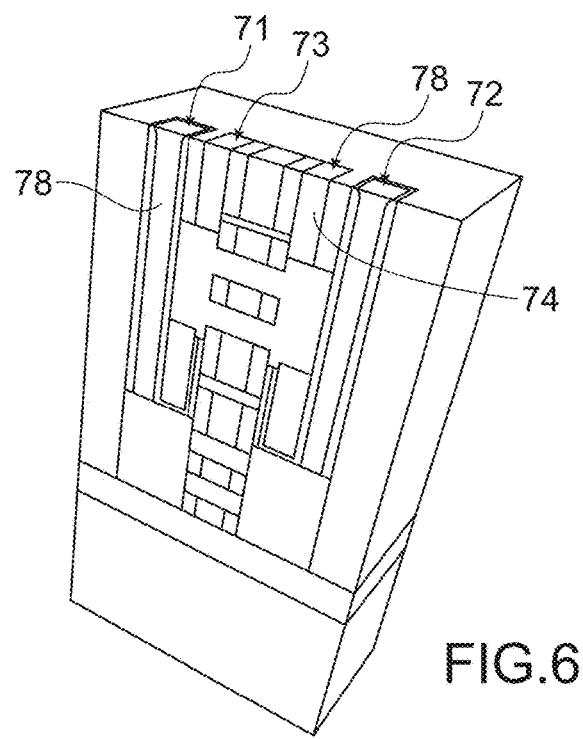

Then, a deposition of conducting material 78, for example TiN and W is made into the holes 69a, 69b and 76a, 76b. The metal is then planarised. The holes 69a, 69b filled with conducting material 78 the respective bottoms of which reveal the semi-conducting blocks 51, 52 form source and drain contact elements 71, 72 of the lower level transistor. The holes 76a, 76b filled with conducting material 78 the respective bottoms of which reveal the semi-conducting blocks 51, 52 form source and drain contact elements 73, 74 of the upper level transistor (FIG. 6G).

An exemplary method for making a surrounding gate for the lower level transistor will now be given in connection with FIGS. 7A-7I.

Figure 7A:
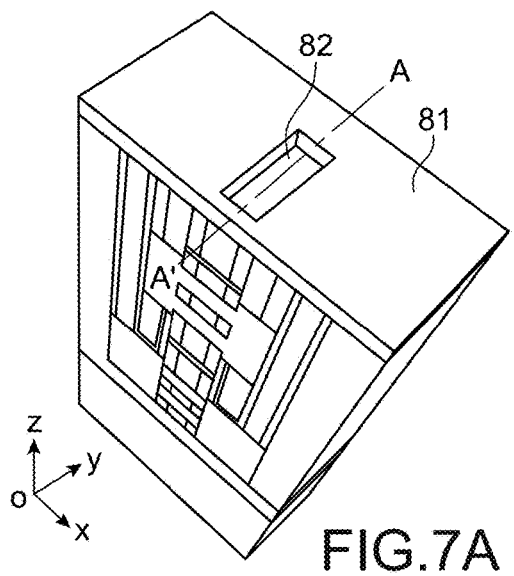
FIGS. 7A-7I are used to illustrate an exemplary embodiment of a surrounding gate for a lower level transistor among said stacked transistors.
Figure 7B:
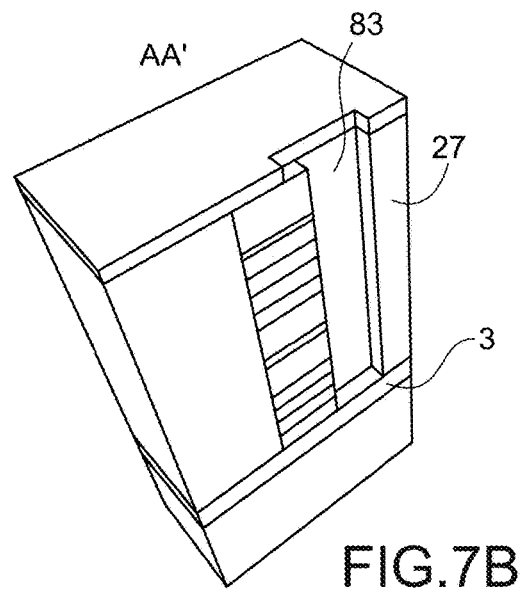

A mask 81 for example based on lithography is first made to form an opening 82 which extends in a direction along a longitudinal axis of the structure and is disposed facing a face of the stacked structure (FIG. 7A). Through this opening 82, an etching is performed to make a hole 83 which extends against a face of the stacked structure, preferably over its entire height (FIG. 7B). This etching can be made through one of the insulating blocks 27 stopping on the insulating layer 3 of the substrate. For example, for silicon oxide etching, $C_4F_6/O_2$ can be used.

Figure 7C:
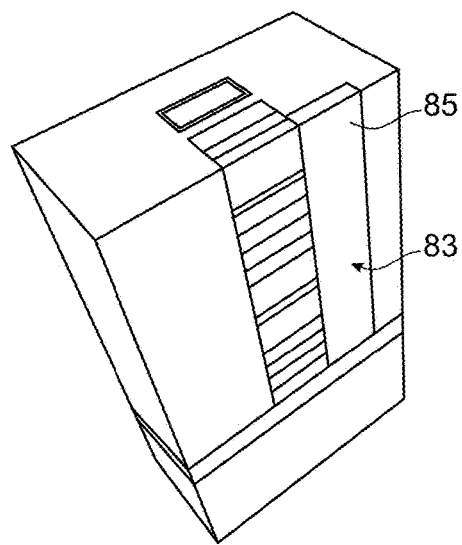
Figure 7D:
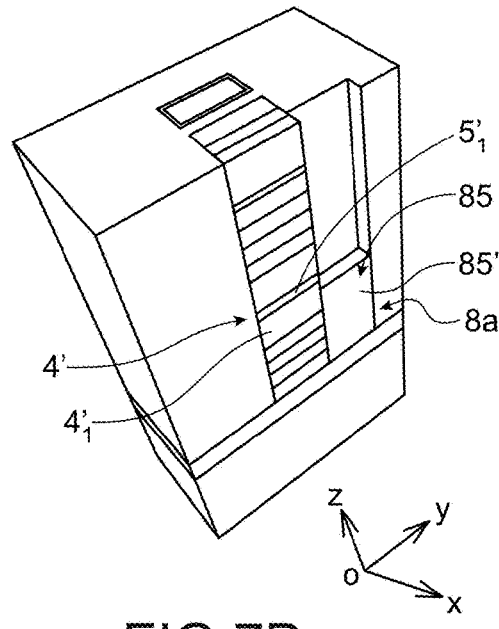

The hole is then filled with a material 85, preferably that can be selectively removed with respect to that of the insulating blocks (FIG. 7C). The material 85 for filling the hole 83 can be for example polysilicon, in particular when the hole is surrounded by silicon oxide. After depositing the material 85, a CMP planarisation step is typically performed with a stop on silicon oxide.

An etching is then performed so as to remove an upper portion of the material 85 in the hole 83. A thickness, in other words a height (dimension measured in parallel to the axis z) of material 85 is in particular removed at the upper part 8b of the structure of stacked rods until the separation layer 4' is reached. A part 85' of the material 85 is kept at the lower part 8a of the structure and thus forms a sacrificial block. In the exemplary embodiment illustrated in FIG. 7D, the removal of the material 85 is advantageously made such that the top or upper face of the sacrificial block 85 is located at the sacrificial layer 4' and more particularly at the sacrificial layer 4'$_1$ located under the semi-conducting layer 5'$_1$ of the stack forming the separation layer 4'.

An insulating block is then made on the sacrificial block 85'.

Figure 7E:
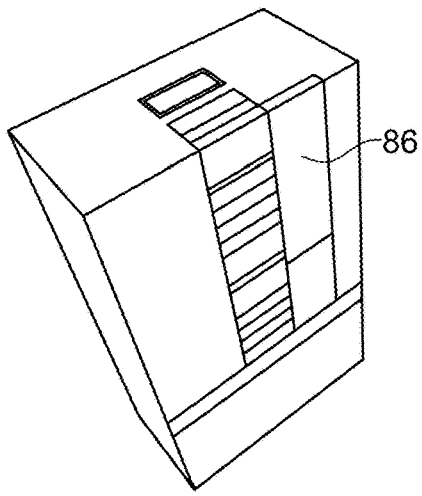

For this, an insulating material 86 is typically deposited into the hole 83. The insulating material 86 is for example silicon oxide (FIG. 7E). The deposition of insulating material 86 can be followed by a CMP planarisation step with a stop on the hard mask. A mask 87 is then formed by lithography including an opening 88, located facing the sacrificial block 85', but which is offset from the opening 83 previously made to form this block 85'.

Figure 7F:
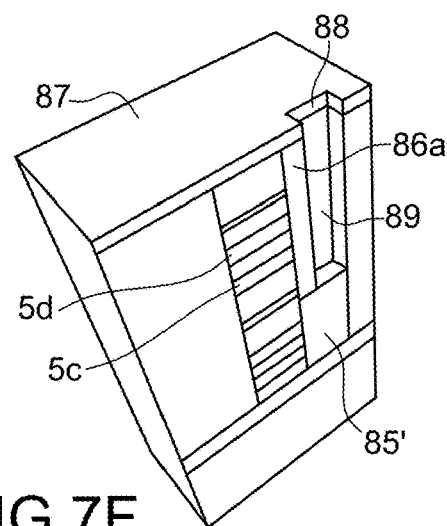
Figure 7G:
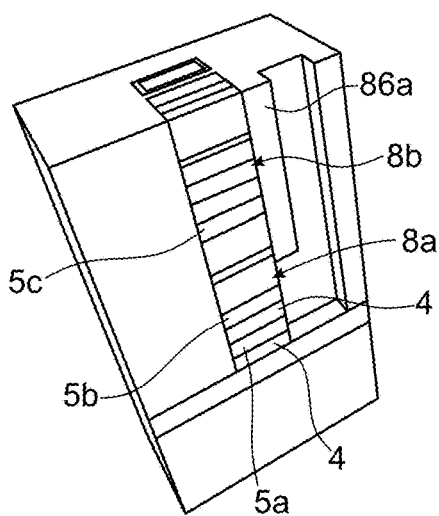

An etching of the insulating material 86 is then performed through the opening 88, so as to form a well 89 through the insulating material 86. This well 89 reveals the sacrificial block 85' and is made while preserving a zone 86a of insulating material 86a against an upper region 8b of the structure in which the second semi-conducting rods 5c, 5d are located (FIG. 7F).

The sacrificial block 85' is then removed by etching in the extension of the well 89. Such an etching enables the semi-conducting rods 5a, 5b belonging to the lower region 8b of the structure to be revealed. A selective etching with respect to silicon oxide is made using for example TMAH or TEAH when the sacrificial block 85' is made of polysilicon.

Figure 7H:
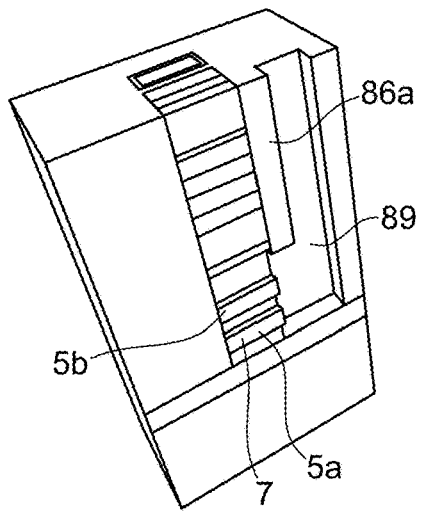

In the extension of a volume left free by the sacrificial block 85' and itself located in the extension of the well 89, a selective removal of the sacrificial layer(s) 4 with respect to the semi-conducting layers 5 is then performed. Thus, a selective etching of the first semi-conductor material 6 with respect to the second semi-conductor material 7 is performed. The semi-conducting rods 5a, 5b of the lower part 8b of said stack are kept whereas the sacrificial layers revealed by said volume left free following the removal of the sacrificial block 85' are in turn removed (FIG. 7H).

Figure 7I:
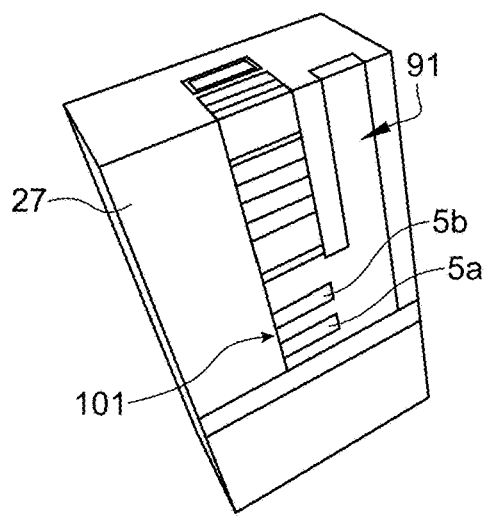

A gate dielectric and at least one gate conducting material are then deposited into the well 89 so as to fill the volume left free by the removal of the sacrificial block as well as the spaces above and under the rods 5a, 5b of semi-conductor material 7. A surrounding gate 91 as illustrated in FIG. 7I is thus formed for the lower level transistor. The coating is here a partial coating insofar as the surrounding gate of the lower level transistor extends against an upper face, a lower face and a side face of the rods 5a, 5b whereas the opposite side face is covered with an insulating region 101, typically based on $SiO_2$, wherein this region can be a remaining portion of the insulating block 27 the making of which has been previously described.

An exemplary method for making a surrounding gate for the upper level transistor will now be given in connection with FIGS. 8A-8D. In the illustrated exemplary embodiment, the gate of the upper level transistor is made after the gate of the lower level transistor. The order of these steps can however be alternatively reversed insofar as the gates are here formed on distinct faces opposite each other of the structure.

Figure 8A:
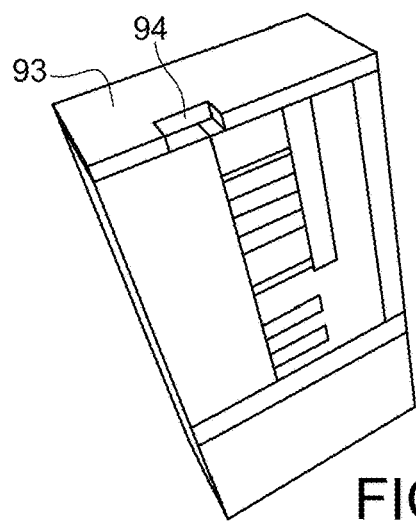
FIGS. 8A-8D are used to illustrate an exemplary embodiment of a surrounding gate for a higher level transistor among said stacked transistors.
Figure 8B:
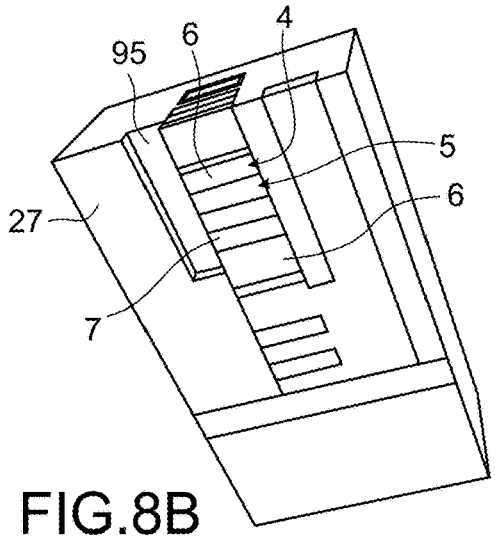

A mask 93 is first made typically by lithography and based on resolving resin including an opening 94 which extends facing a face of the stacked structure (FIG. 8A). Through this opening 94, an etching is then performed to make a hole 95 which extends in the extension of the opening 94 against a face of the stacked structure. Then, the mask 93 is removed (FIG. 8B). The etching of the hole 95 is here made through one of the insulating blocks 27.

Figure 8C:
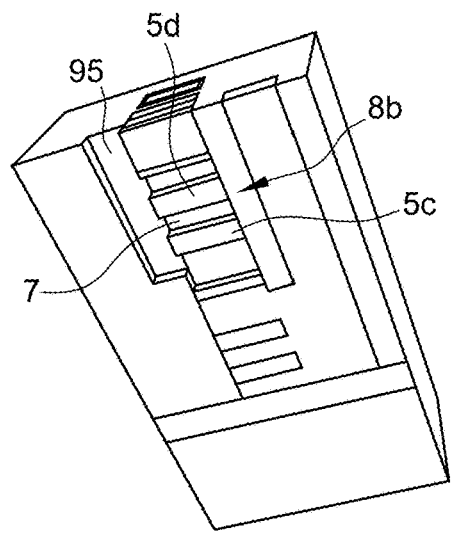
Figure 8D:
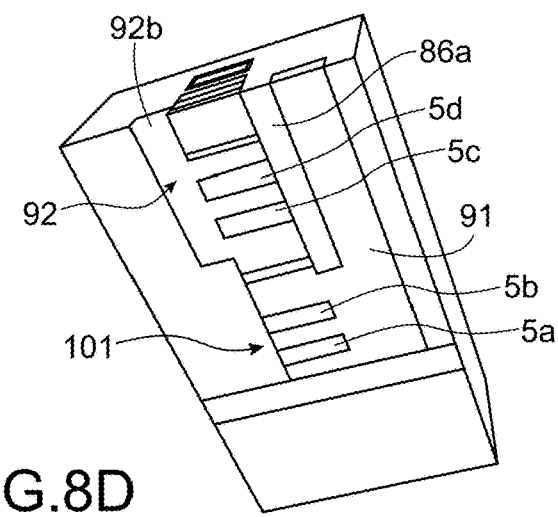

In the extension of the hole 95, a selective removal of the sacrificial layer(s) 4 with respect to the semi-conducting layers 5 is then performed. Thus, the semi-conducting rods 5c, 5d of the upper part of said stack are preserved whereas the sacrificial layers revealed by the hole 95 are removed making a selective etching of the first semi-conductor material 6 with respect to the second semi-conductor material 7 (FIG. 8C).

A gate dielectric and at least one gate conducting material are then deposited into the hole 95 so as to fill spaces above and under the rods 5a, 5b of semi-conductor material 7. Thus, a surrounding gate 92 as that illustrated in FIG. 8D for the upper level transistor is thus formed. The coating is here a partial coating insofar as the surrounding gate of the upper level transistor extends against an upper face, a lower face and a side face of the rods 5c, 5d whereas the opposite side face is covered with the insulating zone 86a.

The making method has been described with a stack in which the sacrificial layers are made of a semi-conductor material. Other couples of materials can also be provided. For example, the Si/SiGe multilayer can be replaced with a multi-layer including alternating insulating layers and semi-conducting layers. Such a stack can be for example formed by epitaxy of sacrificial layers of $CaF_2$ and semi-conducting layers of Si or sacrificial layers of $CaSrF_2$ and semi-conducting layers of SiGe or sacrificial layers of spinel ($MgAl_2O_4$)) and semi-conducting layers of Si. In this case, a selective etching of the sacrificial layer can be made by chemical attack, for example using $HNO_3$ or a $H_2O$ plasma when the purpose is to etch $CaF_2$. Exemplary embodiments of such stacks are given in document "Si-Gate CMOS Devices on a Si/CaF2/Si Structure", by H. Onoda et al., IEEE Trans. Electron Devices, vol ED34-11, p. 2280 (1987), and "CHARACTERISTICS OF MOSFET PREPARED ON Si/MgO·Al2O3/Si02/Si STRUCTURE", by Y. Hokari et al., Tech. Digest IEDM, p. 368 (1983).

The invention claimed is:

1. A method for making a device with stacked transistors comprising:
   a first transistor of a first type, in particular N or P, the first transistor having a channel formed in one or more first semi-conducting rods of a semi-conducting structure including semi-conducting rods disposed above each other and aligned with each other, a first source or drain block of the first transistor and a second drain or source block of the first transistor being disposed at the ends of said one or more first semi-conducting rods,
   a second transistor of a second type, in particular P or N, having a channel region formed in one or more second semi-conducting rods of said semi-conducting structure and disposed above the first semi-conducting rods, a third drain or source block of the second transistor and a fourth drain or source block being respectively disposed at the ends of said one or more second semi-conducting rods,
   said third source or drain block of the second transistor being distinct from the first source or drain block of the second transistor, the fourth drain or source block of the second transistor being disposed above and being distinct from the second drain or source block of the second transistor, the formation of said source and drain first block and second block of the first transistor comprising the steps of:
   forming sacrificial regions on either side of a lower part of the structure, the sacrificial regions being arranged at said ends of said one or more first semi-conducting rods,
   forming insulating blocks on the sacrificial regions while preserving a revealed side zone of the sacrificial regions,
   removing the sacrificial regions so as to form cavities under the insulating blocks and reveal said ends of said one or more first semi-conducting rods,
   epitaxially growing semi-conductor material blocks in said cavities.

2. The method according to claim 1, wherein the formation of said source and drain third block and fourth block of the second transistor comprises:
   removing a thickness of said insulating blocks on either side of an upper part of the structure and revealing said ends of said one or more second semi-conducting rods, the removal of said thickness being performed so as to free up spaces of the ends of said one or more second semi-conducting rods,
   epitaxially growing semi-conductor material blocks in said spaces.

3. The method according to claim 1, wherein said semi-conducting structure is formed by etching a stack including alternating semi-conducting layers and sacrificial layers, said one or more first semi-conducting rods and said one or more second semi-conducting rods being made from said semi-conducting layers.

4. The method according to claim 3, said stack including:
   a lower part with at least one semi-conducting layer and at least one first sacrificial layer,
   an upper part with at least one semi-conducting layer and at least one second sacrificial layer,
   at least one separation layer between the lower part and the upper part, said separation layer having a thickness higher than said first and second sacrificial layers.

5. The method according to claim 1, further comprising the steps of:
   making a surrounding gate around said one or more first rods,
   making a surrounding gate around said one or more second rods.

6. The method according to claim 3, wherein the formation of said semi-conducting structure comprises steps of:
   etching a stack including alternating semi-conducting layers and sacrificial layers, so as to form a stack of rods, with alternating semi-conducting rods and sacrificial rods, so as to form a stack of rods,
   partially and selectively etching sacrificial rods, so as to reduce the side dimensions of the sacrificial rods,
   forming insulating plugs around the sacrificial rods.

* * * * *